United States Patent
Lo et al.

(10) Patent No.: US 12,107,048 B2
(45) Date of Patent: Oct. 1, 2024

(54) LAYOUTS FOR CONDUCTIVE LAYERS IN INTEGRATED CIRCUITS

(71) Applicant: Taiwan Semiconductor Manufacturing Company, Ltd., Hsinchu (TW)

(72) Inventors: Wan-Yu Lo, Hsinchu (TW); Chung-Hsing Wang, Hsinchu (TW); Chin-Shen Lin, Hsinchu (TW); Kuo-Nan Yang, Hsinchu (TW); Meng-Xiang Lee, Hsinchu (TW); Hao-Tien Kan, Hsinchu (TW); Jhih-Hong Ye, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/156,086

(22) Filed: Jan. 18, 2023

(65) Prior Publication Data

US 2023/0154849 A1    May 18, 2023

Related U.S. Application Data

(63) Continuation of application No. 17/351,711, filed on Jun. 18, 2021, now Pat. No. 11,600,568.

(51) Int. Cl.
*H01L 23/528* (2006.01)
*H01L 23/522* (2006.01)

(52) U.S. Cl.
CPC ...... *H01L 23/5286* (2013.01); *H01L 23/5226* (2013.01)

(58) Field of Classification Search
CPC .................... H01L 23/5286; H01L 23/5226
USPC .......................................................... 257/758
See application file for complete search history.

(56) References Cited

U.S. PATENT DOCUMENTS

| | | | |
|---|---|---|---|
| 11,022,834 B1 | 6/2021 | Ishii et al. | |
| 2005/0240894 A1* | 10/2005 | Teig | H01L 23/528 257/773 |
| 2007/0164430 A1* | 7/2007 | Lin | H01L 24/11 257/E21.174 |

* cited by examiner

*Primary Examiner* — Tu-Tu V Ho
(74) *Attorney, Agent, or Firm* — MERCHANT & GOULD P.C.

(57) ABSTRACT

Various layouts for conductive interconnects in the conductor layers in an integrated circuit are disclosed. Some or all of the conductive interconnects are included in a power delivery system. In general, the conductive interconnects in a first conductor layer are arranged according to an orthogonal layout and the conductive interconnects in a second conductor layer are arranged according to a non-orthogonal layout. Conductive stripes in a transition conductor layer positioned between the first and the second conductor layers electrically connect the conductive interconnects in the first conductor layer to the conductive interconnects in the second conductor layer.

20 Claims, 18 Drawing Sheets

| ZZZZ | ML1 LAYER | – – – – | ML1 TRACKS |
| ■■■■ | ML2 LAYER | ·········· | ML2 TRACKS |

■ CONTACT

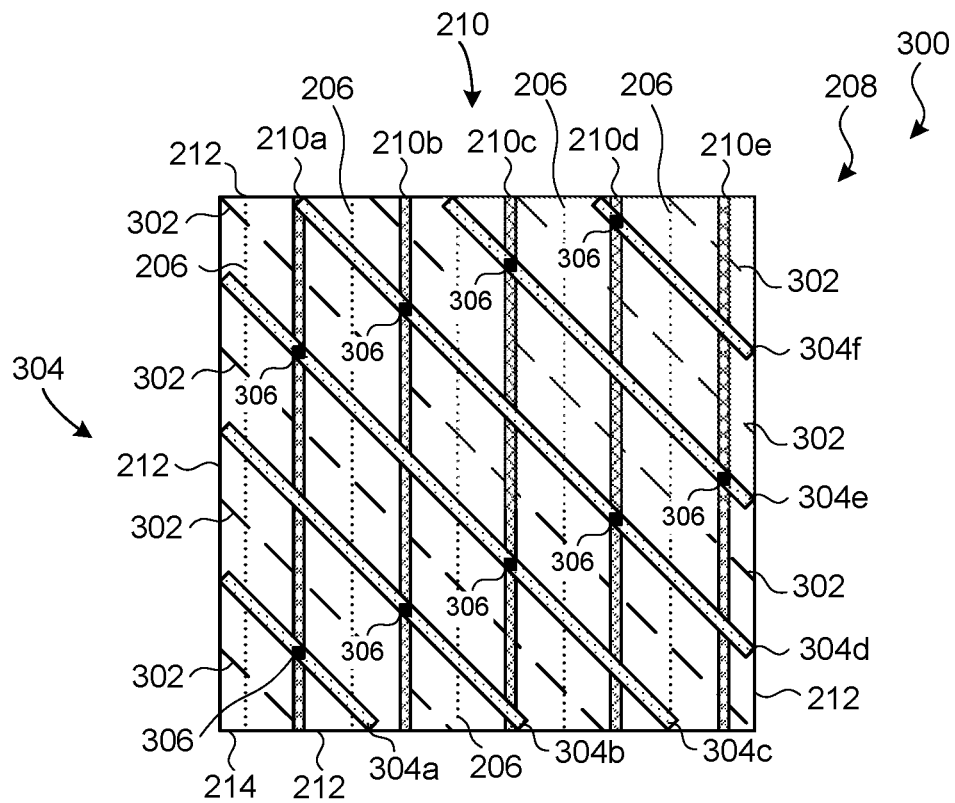
FIG. 3
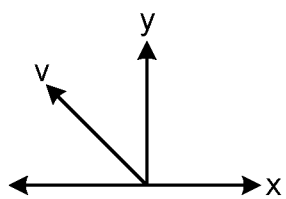

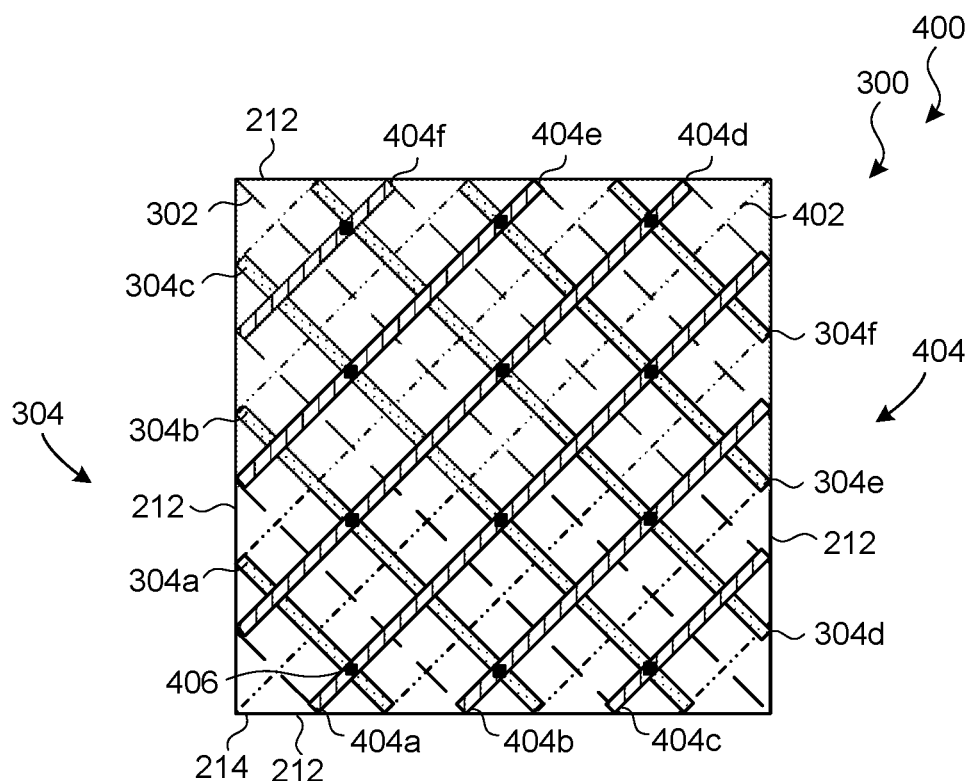
FIG. 4
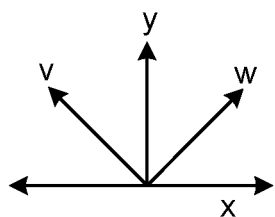

| ML1 LAYER | ML3 LAYER |
| ML2 LAYER | ML4 LAYER |

– – – – – ML1 TRACKS          — — — ML3 Tracks

··········· ML2 TRACKS          —··—··— ML4 Tracks

■ CONTACT

| ML3 LAYER | — — — ML3 TRACKS |
| ML4 LAYER | — ·· — ·· — ML4 TRACKS |
| ■ CONTACT | |

| | | | |
|---|---|---|---|
| ▨ ML1 LAYER | | ▦ ML3 LAYER | |
| ▩ ML2 LAYER | | ▥ ML4 LAYER | |

– – – – – ML1 TRACKS    — — — ML3 TRACKS

·········· ML2 TRACKS    –··–··– ML4 TRACKS

■ CONTACT

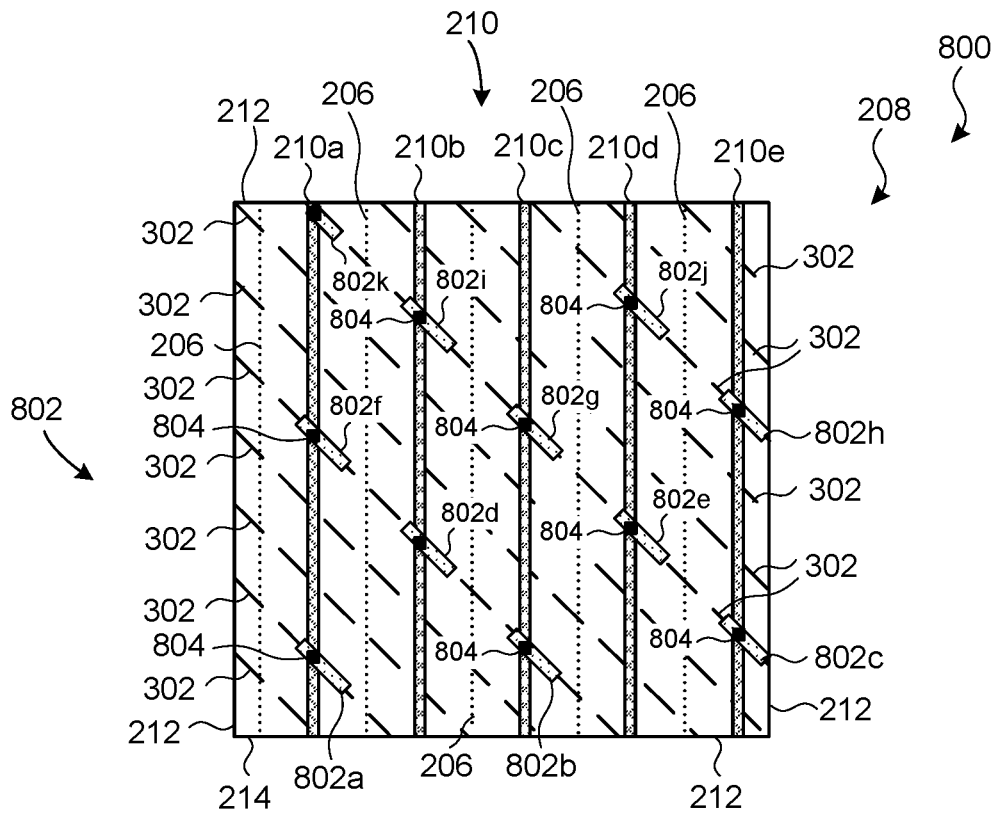
FIG. 8
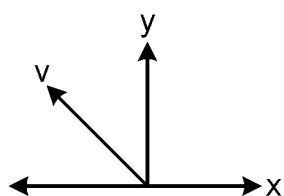
▦ ML2 LAYER ·········· ML2 TRACKS
▦ ML3 LAYER — — — ML3 TRACKS
■ CONTACT

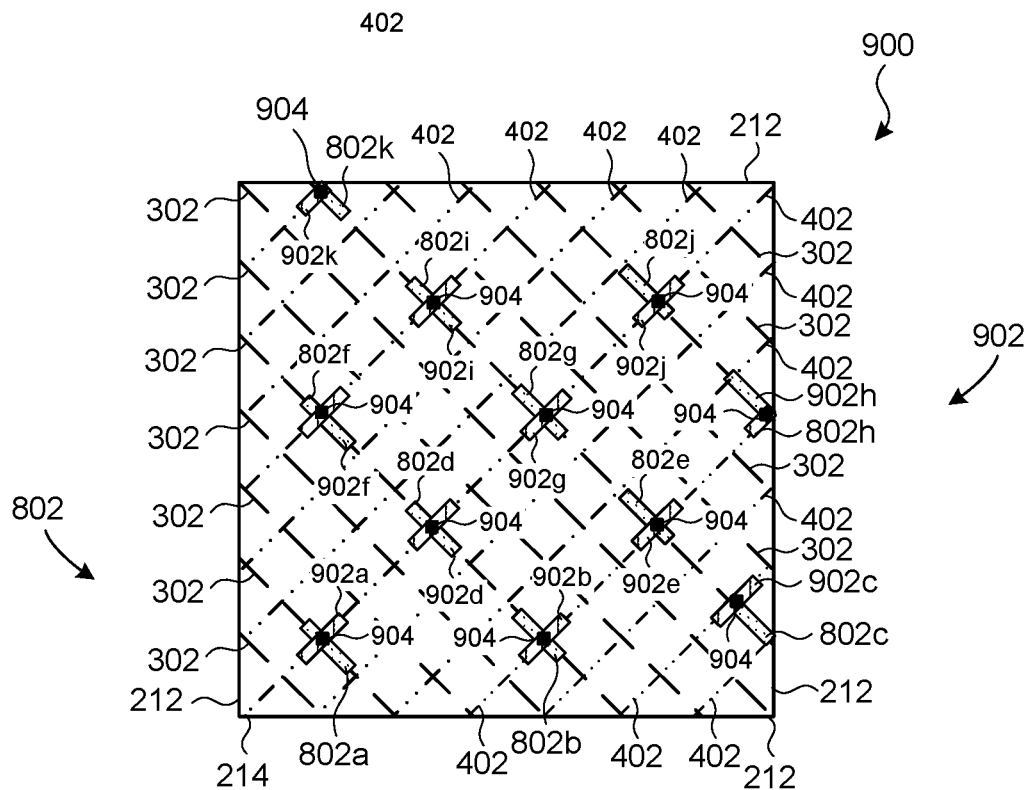
FIG. 9
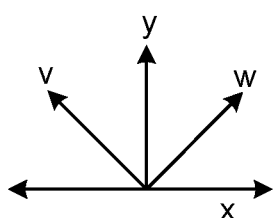
 ML3 LAYER     ML3 TRACKS
 ML4 LAYER     ML4 TRACKS
 CONTACT

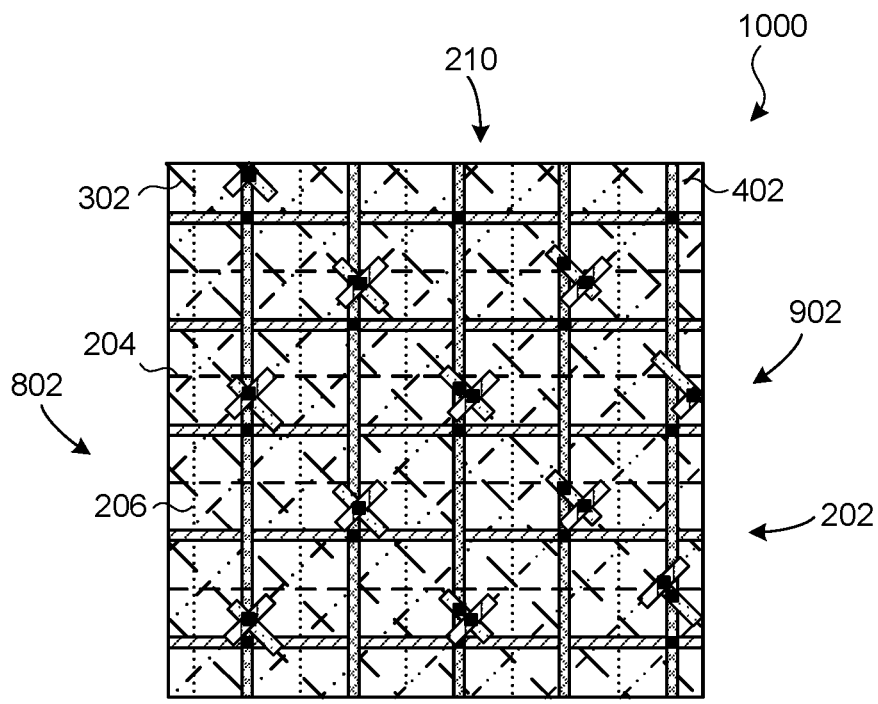
FIG. 10
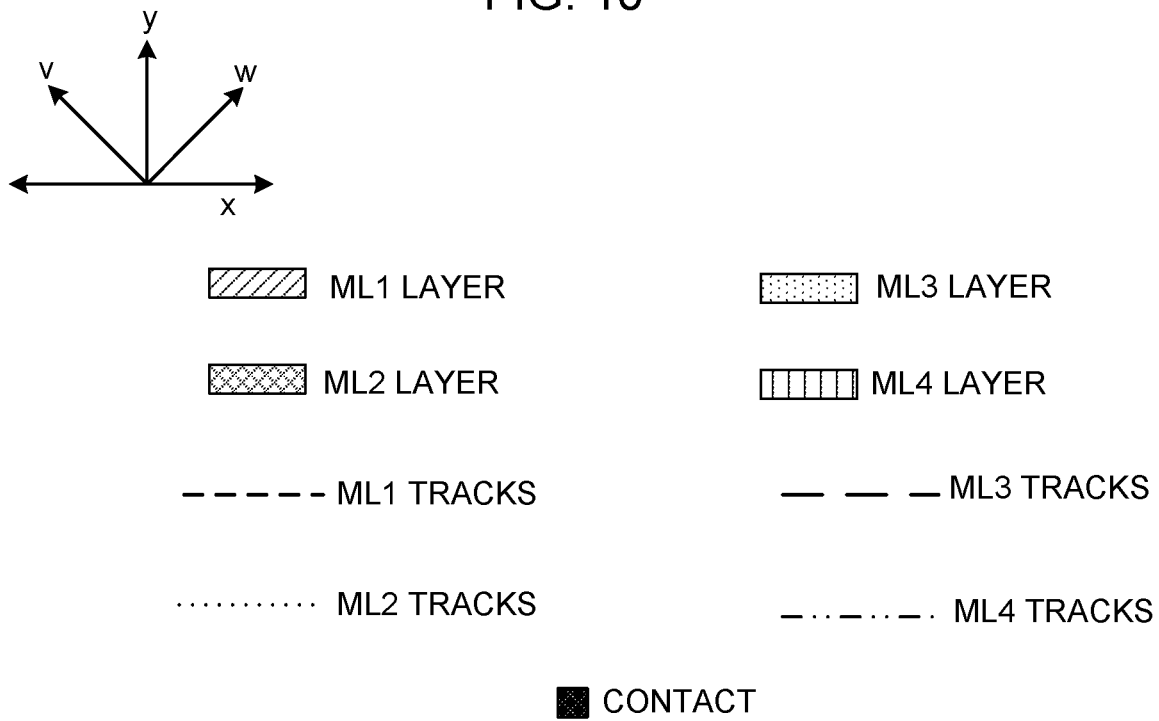

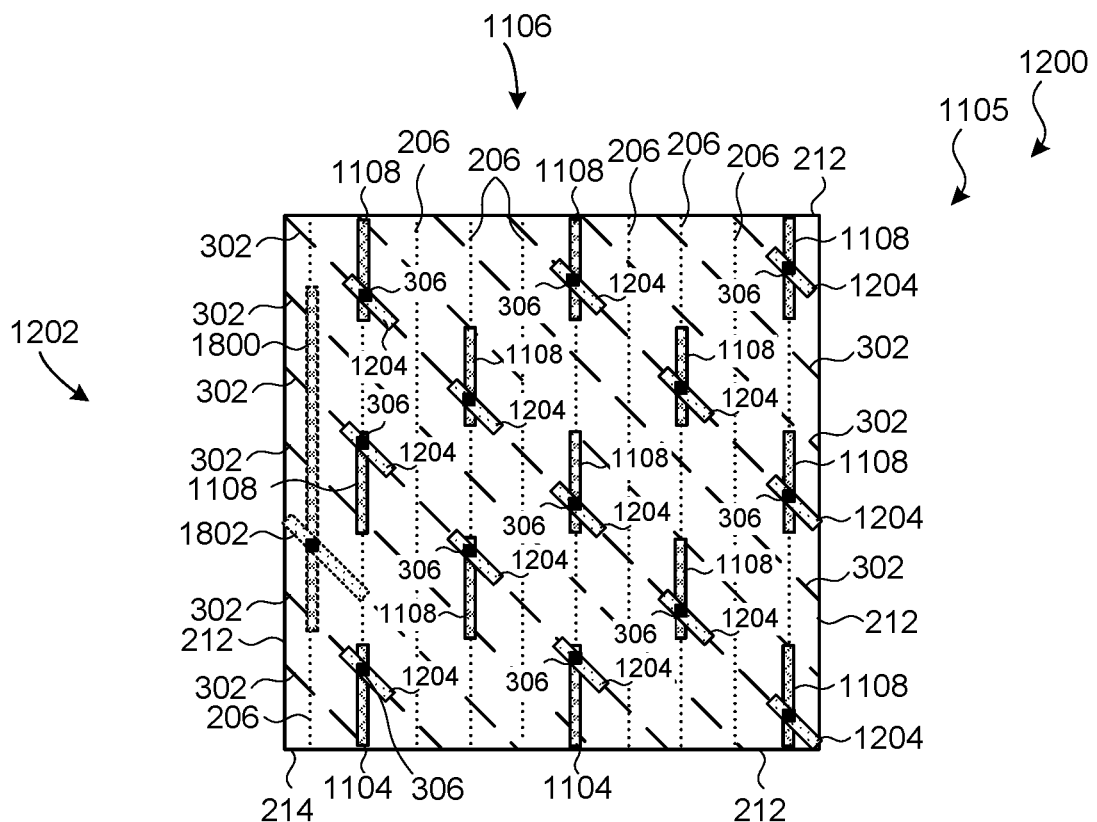
FIG. 12
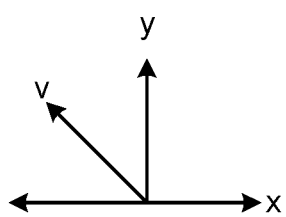

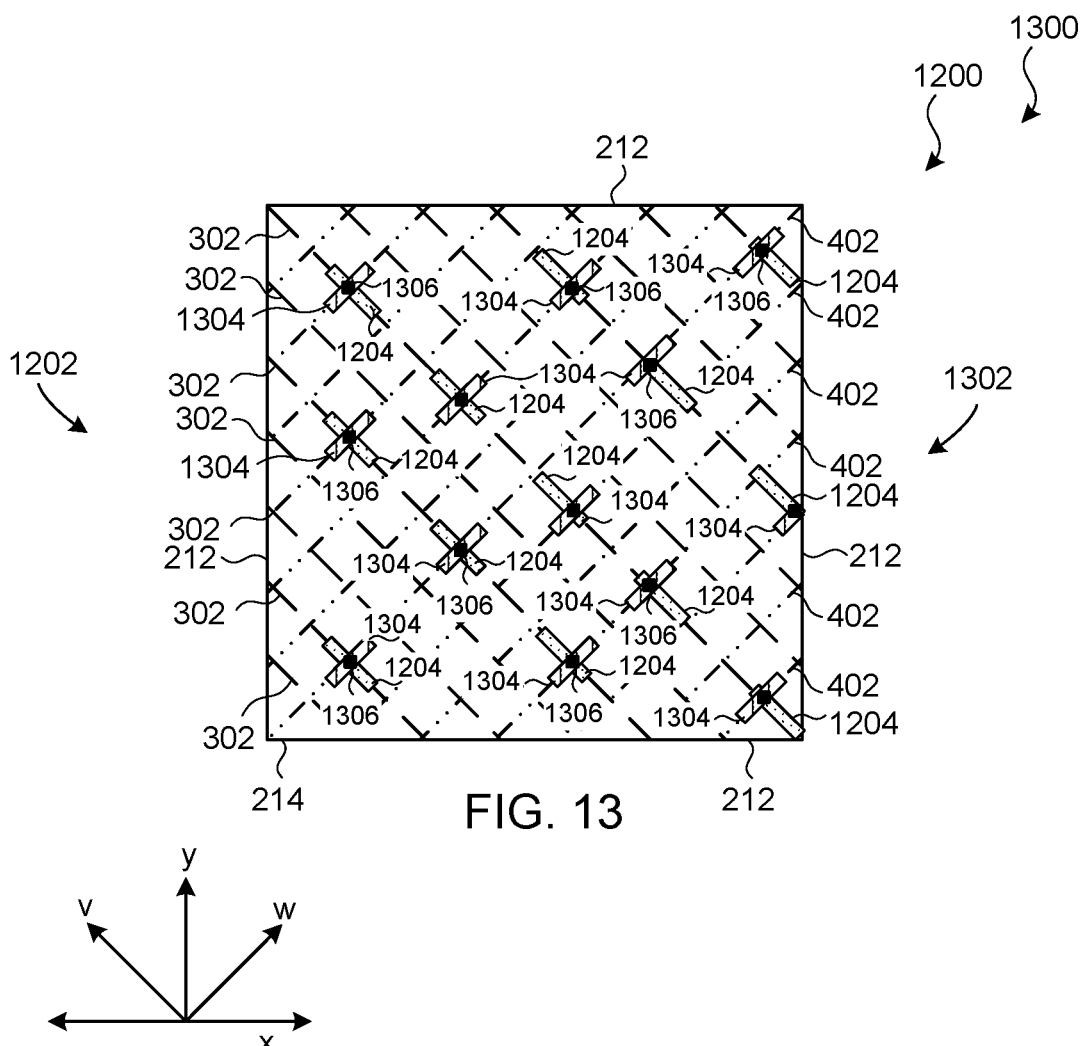
FIG. 13

| | | | |
|---|---|---|---|
| ▨ ML1 LAYER | | ▦ ML3 LAYER | |
| ▩ ML2 LAYER | | ▥ ML4 LAYER | |
| – – – – ML1 TRACKS | | — — — ML3 TRACKS | |
| ·········· ML2 TRACKS | | –··–··–· ML4 TRACKS | |

■ CONTACT

| | | | |
|---|---|---|---|
| ▨ ML1 LAYER | | ▨ ML3 LAYER | |
| ▨ ML2 LAYER | | ▥ ML4 LAYER | |

- - - - - ML1 TRACKS         — — — ML3 TRACKS

············ ML2 TRACKS         —··—··— ML4 TRACKS

■ CONTACT

LAYOUTS FOR CONDUCTIVE LAYERS IN INTEGRATED CIRCUITS

RELATED APPLICATION

This application is a continuation application of U.S. patent application Ser. No. 17/351,711, filed Jun. 18, 2021, now U.S. Pat. No. 11,600,568, which is incorporated herein in its entirety by reference.

BACKGROUND

An integrated circuit includes a substrate, one or more circuits above the substrate, and metal lines that interconnect the components of a circuit and/or interconnect one circuit to another circuit. Prior to fabrication of the integrated circuit, a layout of the metal conductors in the integrated circuit is created. The metal conductors route signals and power or voltage sources to the components in the integrated circuit. The metal conductors that route voltage sources are part of a power delivery network that distributes one or more voltages to the active components in the integrated circuit. Conventional layouts of the metal conductors do not always route the signals and the voltage sources efficiently.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

FIG. 3 depicts the first example layout for the second metal layer shown in FIG. 2 and a first example layout for a third metal layer in the first integrated circuit in accordance with some embodiments;

FIG. 4 illustrates the first example layout for the third metal layer shown in FIG. 3 and a first example layout for a fourth metal layer in the first integrated circuit in accordance with some embodiments;

FIG. 8 illustrates the first example layout of the second metal layer shown in FIG. 2 and an example third layout of a third metal layer in a third integrated circuit in accordance with some embodiments;

FIG. 9 depicts the third example layout of the third metal layer shown in FIG. 8 and an example layout of a fourth metal layer in the third integrated circuit in accordance with some embodiments;

FIG. 10 illustrates a complete layout for the metal layers in the third integrated circuit in accordance with some embodiments;

FIG. 12 illustrates the second example layout of the second metal layer shown in FIG. 11 and an example fourth layout for a third metal layer in the fourth integrated circuit in accordance with some embodiments;

FIG. 13 depicts a fourth example layout of the third metal layer shown in FIG. 12 and a fourth metal layer in the fourth integrated circuit in accordance with some embodiments;

DETAILED DESCRIPTION

Figure 1:
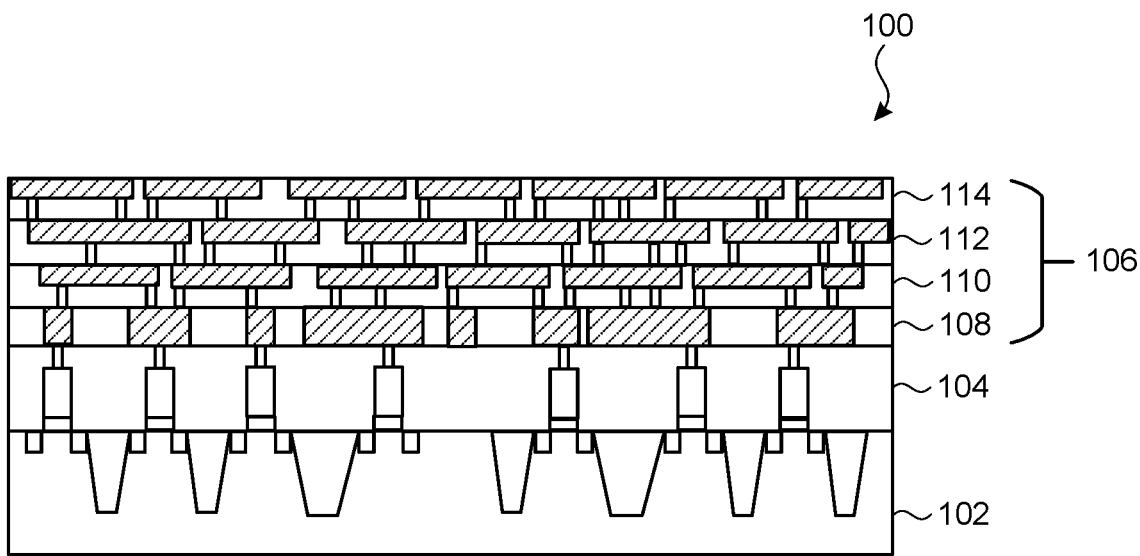
FIG. 1 depicts a cross-sectional view of an example integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Integrated circuits are commonly used in various electronic devices. Integrated circuits include circuits and/or components that provide or contribute to the functionality or functionalities of the integrated circuit. Non-limiting example circuits are logic components such as a flip flop, latch, inverter, NAND, OR, AND, and NOR circuits, as well as amplifiers, buffers, and transistors. Conductive interconnects, such as metal conductors, are commonly used to route signals and power (e.g., voltage sources) to and from the circuits (or contact pads associated with the circuits) and/or the components, as well as the integrated circuit itself. Conventional routing layouts for the metal conductors route the metal conductors orthogonally with respect to a design boundary. In a non-limiting example, the design boundary is the edges of a chip or die of the integrated circuit. However, in some instances, orthogonal routing is not the shortest distance between two components.

Embodiments disclosed herein provide various layouts for the metal conductors in an integrated circuit. The metal conductors can be part of a power delivery network in the integrated circuit. A power delivery network includes the metal conductors that deliver one or more voltage sources to the circuits of an integrated circuit. Example voltage sources are VDD, VSS, and ground.

In some embodiments, the layouts vary between a layout that includes orthogonal routings or tracks for the metal conductors with respect to a design boundary of the integrated circuit, a layout that includes either orthogonal or non-orthogonal tracks for the metal conductors with respect to the design boundary of the integrated circuit, and a layout that includes non-orthogonal tracks for the metal conductors with respect to the design boundary of the integrated circuit. The disclosed layouts for the metal conductors at least reduce the amount of area that is used for routing the metal conductors, reduce the amount of time needed to route the signals and voltage sources, and/or improve the performance of the integrated circuit.

In some embodiments, the metal conductors in a transition metal layer are implemented as metal stripes that are arranged in either an orthogonal layout or in a non-orthogonal layout. The transition metal layer is used as an intermediate metal layer between a metal layer arranged in an orthogonal layout ("orthogonal metal layer") and a metal layer arranged in a non-orthogonal layout ("non-orthogonal metal layer"). The metal stripes in the transition metal layer can provide better electrical connections between the metal conductors in the orthogonal metal layer and the metal conductors in the non-orthogonal metal layer. As non-limiting examples, the electrical connections can be more secure (e.g., stronger), more reliable, more consistent, and/or enable higher current or voltage levels to be transmitted between the orthogonal and non-orthogonal metal layers.

The embodiments described herein are described with respect to metal layers and metal conductors. However, other embodiments are not limited to metal layers and metal conductors. Any suitable conductor that is made of one or more conductive materials can be used. Additionally, the conductors can be formed in one or more conductor layers.

These and other embodiments are discussed below with reference to FIGS. 1-17C. However, those skilled in the art will readily appreciate that the detailed description given herein with respect to these Figures is for explanatory purposes only and should not be construed as limiting.

FIG. 1 depicts a cross-sectional view of an example integrated circuit in accordance with some embodiments. The integrated circuit 100 includes a substrate 102, a circuit 104, and an interconnect structure 106. The substrate 102 is implemented with any suitable substrate. For example, the substrate 102 can be a semiconductor substrate, a gallium nitride substrate, or a silicon carbide substrate.

The circuit 104 is disposed in, on and/or above the substrate 102 and can include passive and/or active components. Example circuits 104 include, but are not limited to, a resistor, a capacitor, a transistor, a diode, an amplifier, a NAND circuit, a NOR circuit, an inverter, a flip flop, a latch, or combinations thereof.

The interconnect structure 106 includes metal layers 108, 110, 112, 114 (e.g., M0-M3 metal layers) that are arranged sequentially above the circuit 104. Each metal layer 108, 110, 112, 114 includes metal conductors that interconnect a component of the circuit 104 to another component or circuit and/or to one or more power sources (e.g., VDD and VSS). In one embodiment, the metal conductors in at least one metal layer are implemented as metal lines. Additionally or alternatively, the metal conductors in at least one metal layer are configured as metal pillars. Although FIG. 1 presents four metal layers 108, 110, 112, 114 and one circuit 104, other embodiments can include any number of metal layers and/or any number of circuits and/or components.

The layouts disclosed herein are described in conjunction with metal conductors that are included in a power delivery network for an integrated circuit. For example, the metal conductors are used to route one or more voltage sources in the integrated circuit, such as VDD, VSS, and/or ground. However, in other embodiments, the layouts can be used for metal conductors that route signals in the integrated circuit in addition to, or as an alternative to, the metal conductors in the power delivery system.

Figure 2:
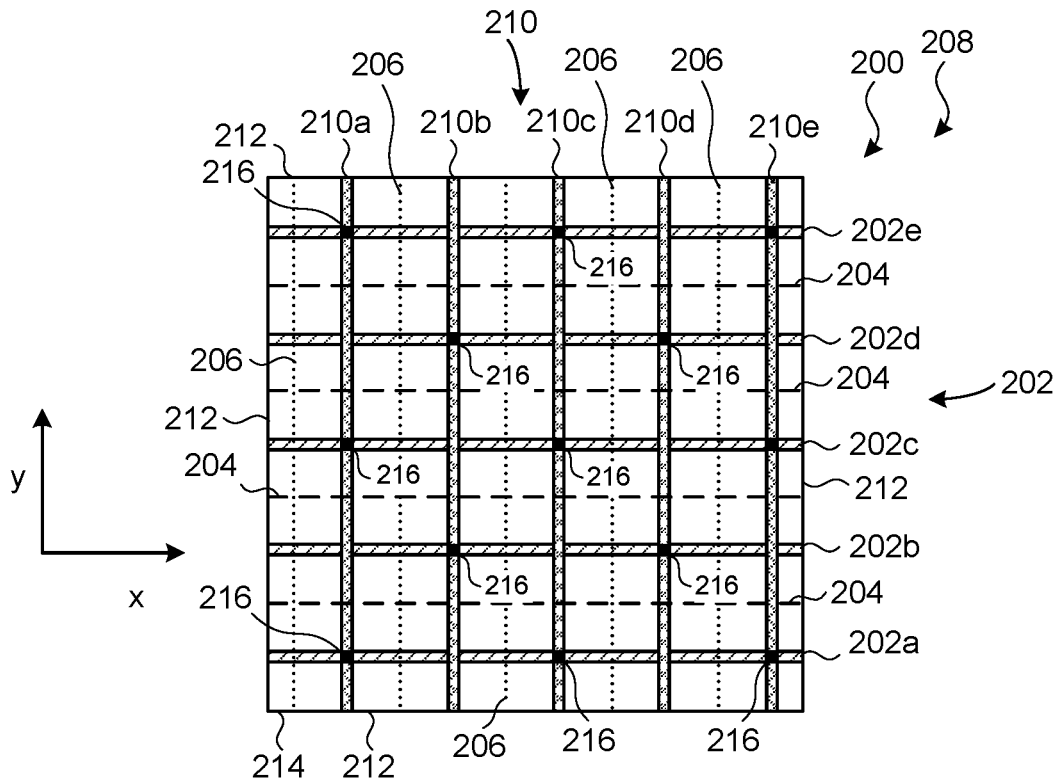
FIG. 2 illustrates a first example layout for a first metal layer and a first example layout for a second metal layer in a first integrated circuit in accordance with some embodiments.
Figure 5:
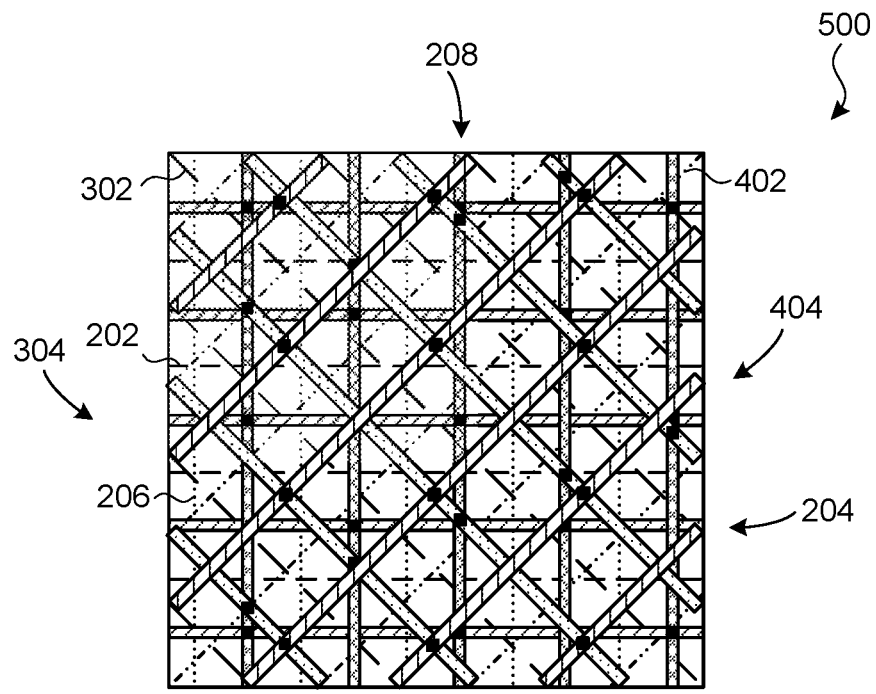
FIG. 5 depicts a complete layout for the metal layers in the first integrated circuit in accordance with some embodiments.

FIGS. 2-4 show layouts for four metal layers in a first integrated circuit, and FIG. 5 represents the complete layout for the metal layers in the first integrated circuit. FIG. 2 illustrates a first example layout for a first metal layer and a first example layout for a second metal layer in a first integrated circuit in accordance with some embodiments. The example layout 200 for the first metal ("ML1") layer 202 includes tracks 204 disposed in the x direction. The tracks 204 represent paths or routes for the metal conductors in the ML1 layer 202 in the first integrated circuit. In the illustrated embodiment, the metal conductors 202a, 202b, 202c, 202d, 202e of the ML1 layer 202 are positioned along some of the tracks 204. The tracks 204 underlying the metal conductors 202a, 202b, 202c, 202d, 202e are not visible in FIG. 2 because the metal conductors 202a, 202b, 202c, 202d, 202e are disposed over the tracks 204.

Tracks 206 are disposed in the y direction in the example layout 208 for a second metal ("ML2") layer 210. The ML2 layer 210 is formed above the ML1 layer 202. The tracks 206 represent routes for the metal conductors in the ML2 layer 210 in the first integrated circuit. Metal conductors 210a, 210b, 210c, 210d, 210e of the ML2 layer 210 are positioned along some of the tracks 206. The tracks 206 underlying the metal conductors 210a, 210b, 210c, 210d, 210e are not visible in FIG. 2 because the metal conductors 210a, 210b, 210c, 210d, 210e are disposed over the tracks 206.

In FIG. 2, the metal conductors 202a, 202b, 202c, 202d, 202e of the ML1 layer 202 and the metal conductors 210a, 210b, 210c, 210d, 210e of the ML2 layer 210 are implemented as metal stripes that extend from one edge of the design boundary to another edge of the design boundary. Some or all of the metal conductors 202a, 202b, 202c, 202d, 202e, 210a, 210b, 210c, 210d, 210e can deliver one or more voltage sources to the integrated circuit. As shown, the tracks 204, 206, the metal conductors 202a, 202b, 202c, 202d, 202e, and the metal conductors 210a, 210b, 210c, 210d, 210e are orthogonal to a design boundary 212 (e.g., perpendicular or parallel to an edge of the design boundary). As such, the layouts 200, 208 are referred to as orthogonal layouts and the metal layers 202, 210 as orthogonal metal layers. Additionally, the metal conductors 210a, 210b, 210c, 210d, 210e are orthogonal to the metal conductors 202a, 202b, 202c, 202d, 202e. The metal conductors 202a, 202b, 202c, 202d, 202e are positioned at zero (0) degrees and the metal conductors 210a, 210b, 210c, 210d, 210e at ninety (90) degrees with respect to the boundary edge 214. In one embodiment, the ML1 layer 202 is the metal layer 108 and the ML2 layer 210 is the metal layer 110 shown in FIG. 1.

Contacts 216 electrically connect some or all of the metal conductors 210a, 210b, 210c, 210d, 210e to respective metal conductors 202a, 202b, 202c, 202d, 202e. In the illustrated embodiment, contacts 216 electrically connect the metal conductor 210a of the ML2 layer 210 to the metal conductors 202a, 202c, 202e of the ML1 layer 202, the metal conductor 210c of the ML2 layer 210 to the metal conductors 202a, 202c, 202e of the ML1 layer 202, and the metal conductor 210e of the ML2 layer 210 to the metal conductors 202a, 202c, 202e of the ML1 layer 202. Contacts 216 also electrically connect the metal conductor 210b of the ML2 layer 210 to the metal conductors 202b, 202d of the ML1 layer 202, and the metal conductor 210d of the ML2 layer 210 to the metal conductors 202b, 202d of the ML1 layer 202.

FIG. 3 depicts the first example layout for the second metal layer shown in FIG. 2 and a first example layout for a third metal layer in the first integrated circuit in accordance with some embodiments. The layout 208 includes the tracks 206 for the ML2 layer 210 and the metal conductors 210a, 210b, 210c, 210d, 210e of the ML2 layer 210 positioned along some of the tracks 206. Like FIG. 2, the tracks 206 underlying the metal conductors 210a, 210b, 210c, 210d, 210e are not visible in FIG. 2 because the metal conductors 210a, 210b, 210c, 210d, 210e are disposed over the tracks 206.

The example layout 300 for a third metal ("ML3") layer 304 includes tracks 302 that are disposed in the v direction. The ML3 layer 304 is formed above the ML2 layer 210. In the illustrated embodiment, the v direction represents one hundred and thirty five (135) degrees with respect to the boundary edge 214.

The tracks 302 represent routes for the metal conductors in the ML3 layer 304 in the first integrated circuit. In one embodiment, the ML3 layer 304 is the metal layer 112 shown in FIG. 1. Metal conductors 304a, 304b, 304c, 304d, 304e, 304f of the ML3 layer 304 are positioned along some of the tracks 302. The tracks 302 underlying the metal conductors 304a, 304b, 304c, 304d, 304e, 304f are not visible in FIG. 3 because the metal conductors 304a, 304b, 304c, 304d, 304e, 304f are disposed over the tracks 302.

In FIG. 3, the metal conductors 304a, 304b, 304c, 304d, 304e, 304f of the ML3 layer 304 are implemented as metal stripes. Some or all of the metal conductors 304a, 304b, 304c, 304d, 304e, 304f can deliver one or more voltage sources to the integrated circuit. As shown, the tracks 302 and the metal conductors 304a, 304b, 304c, 304d, 304e, 304f are not orthogonal with respect to the design boundary 212 of the first integrated circuit, while the tracks 206 and the metal conductors 210a, 210b, 210c, 210d, 210e are orthogonal to the design boundary 212. As such, the layout 300 for the ML3 layer is referred to as a non-orthogonal layout and the metal layer 304 as a non-orthogonal metal layer. Additionally, the metal conductors 304a, 304b, 304c, 304d, 304e, 304f are not orthogonal to the metal conductors 210a, 210b, 210c, 210d, 210e. The metal conductors 210a, 210b, 210c, 210d, 210e are positioned at ninety (90) degrees and the metal conductors 304a, 304b, 304c, 304d, 304e, 304f at one hundred and thirty-five (135) degrees with respect to the boundary edge 214.

Contacts 306 electrically connect some or all of the metal conductors 304a, 304b, 304c, 304d, 304e, 304f to respective metal conductors 210a, 210b, 210c, 210d, 210e. In the illustrated embodiment, contacts 306 electrically connect the metal conductor 304a of the ML3 layer 304 to the metal conductor 210a of the ML2 layer 210, the metal conductor 304b of the ML3 layer 304 to the metal conductor 210b of the ML2 layer 210, and the metal conductor 304f of the ML3 layer 304 to the metal conductor 210d of the ML2 layer 210. Contacts 306 electrically connect the metal conductor 304c of the ML3 layer 304 to the metal conductors 210a, 210c of the ML2 layer 210, and the metal conductor 304d of the ML3 layer 304 to the metal conductors 210b, 210d of the ML2 layer 210, and the metal conductor 304e of the ML3 layer 304 to the metal conductors 210c, 210e of the ML2 layer 210.

FIG. 4 illustrates the first example layout for the third metal layer shown in FIG. 3 and a first example layout for a fourth metal layer in the first integrated circuit in accordance with some embodiments. The layout 300 includes the tracks 302 for the ML3 layer 304 and the metal conductors 304a, 304b, 304c, 304d, 304e, 304f of the ML3 layer 304 positioned along some of the tracks 302. The layout 400 for a fourth metal ("ML4") layer 404 includes tracks 402 that are disposed in the w direction. The ML4 layer 404 is formed above the ML3 layer 304. In the illustrated embodiment, the w direction represents forty-five (45) degrees with respect to the boundary edge 214.

The tracks 402 represent routes for the metal conductors in the ML4 layer 404 in the first integrated circuit. Metal conductors 404a, 404b, 404c, 404d, 404e, 404f of the ML4 layer 404 are positioned along some of the tracks 402. In one embodiment, the ML4 layer 404 is the metal layer 114 shown in FIG. 1.

In FIG. 4, the metal conductors 404a, 404b, 404c, 404d, 404e, 404f of the ML4 layer 404 are implemented as metal stripes. Some or all of the metal conductors 404a, 404b, 404c, 404d, 404e, 404f can deliver one or more voltage sources to the integrated circuit. As shown, the tracks 402 and the metal conductors 404a, 404b, 404c, 404d, 404e, 404f are not orthogonal to the design boundary 212. As such, the layout 400 for the ML4 layer is referred to as a non-orthogonal layout and the metal layer 404 as a non-orthogonal metal layer. Additionally, the metal conductors 404a, 404b, 404c, 404d, 404e, 404f are orthogonal to the metal conductors 304a, 304b, 304c, 304d, 304e, 304f. The metal conductors 404a, 404b, 404c, 404d, 404e, 404f are positioned at forty-five (45) degrees and the metal conductors 304a, 304b, 304c, 304d, 304e, 304f at one hundred and thirty-five (135) degrees with respect to the boundary edge 214.

Contacts 406 electrically connect some or all of the metal conductors 404a, 404b, 404c, 404d, 404e, 404f to respective metal conductors 304a, 304b, 304c, 304d, 304e, 304f In the illustrated embodiment, contacts 406 electrically connect the metal conductor 404a of the ML4 layer 404 to the metal conductors 304a, 304c, 304e of the ML3 layer 304, and the metal conductor 404d of the ML4 layer 404 to the metal conductors 304b, 304d, 304f of the ML3 layer 304. Contacts 406 electrically connect the metal conductor 404b of the ML4 layer 404 to the metal conductors 304b, 304d of the ML3 layer 304, the metal conductor 404e of the ML4 layer 404 to the metal conductors 304c, 304e of the ML3 layer 304, the metal conductor 404c of the ML4 layer 404 to the metal conductor 304c of the ML3 layer 304, and the metal conductor 404f of the ML4 layer 404 to the metal conductor 304d of the ML3 layer 304.

In one embodiment, some or all of the metal conductors 202a, 202b, 202c, 202d, 202e in the ML1 layer 202 are included in a PDN and some or all of the metal conductors 304a, 304b, 304c, 304d, 304e, 304f in the ML3 layer 304 are included in the PDN. As such, the ML2 layer 210 is a transition layer. The metal conductors 210a, 210b, 210c, 210d, 210e are configured as metal stripes and some or all of the metal conductors 210a, 210b, 210c, 210d, 210e connect respective metal conductors 202a, 202b, 202c, 202d, 202e in the underlying orthogonal metal layer (the ML1 layer 202) to respective metal conductors 304a, 304b, 304c, 304d, 304e, 304f in the overlying non-orthogonal metal layer (the ML3 layer 304).

In another embodiment, some or all of the metal conductors 210a, 210b, 210c, 210d, 210e in the ML2 layer 210 are included in a PDN and some or all of the metal conductors 404a, 404b, 404c, 404d, 404e, 404f in the ML4 layer 404 are included in the PDN. As such, the ML3 layer 304 is a transition layer. The metal conductors 304a, 304b, 304c, 304d, 304e, 304f are implemented as metal stripes and some or all of the metal conductors 304a, 304b, 304c, 304d, 304e, 304f connect respective metal conductors 210a, 210b, 210c, 210d, 210e in the underlying orthogonal metal layer (the ML2 layer 210) to respective metal conductors 404a, 404b, 404c, 404d, 404e, 404f in the overlying non-orthogonal metal layer (the ML4 layer 404).

FIG. 5 depicts a complete layout for the metal layers in the first integrated circuit in accordance with some embodiments. The complete layout 500 includes tracks 204, 206, 302, 402 and the ML1, the ML2, the ML3 and ML4 layers 202, 210, 304, 404. As described earlier, the metal conductors in the ML1, the ML2, the ML3, and the ML4 layers 202, 210, 304, 404 are implemented as metal stripes. In one embodiment, the ML2 layer 210 is a transition layer that connects one or more metal conductors 202a, 202b, 202c, 202d, 202e in the underlying orthogonal metal layer (the ML1 layer 202) to respective metal conductors 304a, 304b, 304c, 304d, 304e, 304f in the overlying non-orthogonal metal layer (the ML3 layer 304). In another embodiment, the ML3 layer 304 is a transition layer that connects one or more metal conductors 210a, 210b, 210c, 210d, 210e in the underlying orthogonal metal layer (the ML2 layer 210) to respective metal conductors 404a, 404b, 404c, 404d, 404e, 404f in the overlying non-orthogonal metal layer (the ML4 layer 404).

Figure 6:
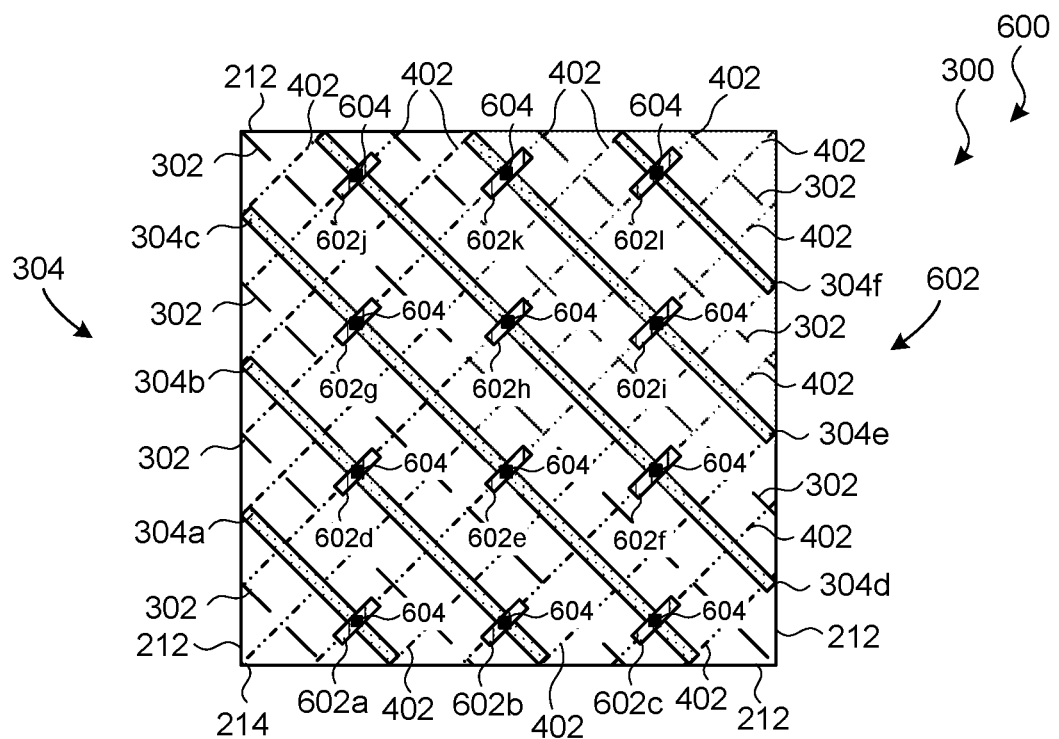
FIG. 6 illustrates a second example layout for a third metal layer and a second example layout for a fourth metal layer in a second integrated circuit in accordance with some embodiments.
Figure 6:
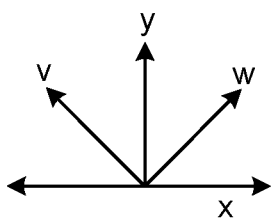

In some embodiments, the example layout 200 shown in FIG. 2 is combined with the example layout shown in FIG. 6 for the metal layers in a second integrated circuit. FIG. 6 illustrates a second example layout for a third metal layer and a second example layout for a fourth metal layer in a second integrated circuit in accordance with some embodiments. The example layout 300 for the ML3 layer 304 includes the tracks 302 shown in FIG. 3 and the metal conductors 304a, 304b, 304c, 304d, 304e, 304f positioned along some of the tracks 302. The tracks 302 underlying the metal conductors 304a, 304b, 304c, 304d, 304e, 304f are not visible in FIG. 6 because the metal conductors 304a, 304b, 304c, 304d, 304e, 304f are disposed over the tracks 302.

The layout 600 for the ML4 layer 602 includes tracks 402 disposed in the w direction with respect to the boundary edge 214. The ML4 layer 602 is formed above the ML3 layer 304. Metal conductors 602a, 602b, 602c, 602d, 602e, 602f, 602g, 602h, 602i, 602j, 602k, 602l of the ML4 layer 602 are positioned along some of the tracks 402. The tracks 402 underlying the metal conductors 602a, 602b, 602c, 602d, 602e, 602f, 602g, 602h, 602i, 602j, 602k, 602l are not visible in FIG. 6 because the metal conductors 602a, 602b, 602c, 602d, 602e, 602f, 602g, 602h, 602i, 602j, 602k, 602l are disposed over the tracks 402. In the illustrated embodiment, the w direction represents forty-five (45) degrees.

In FIG. 6, the metal conductors 602a, 602b, 602c, 602d, 602e, 602f, 602g, 602h, 602i, 602j, 602k, 602l are configured as metal pillars. A metal pillar provides a structure for contacts between the metal pillar and a metal conductor or an element (e.g., a polysilicon gate, a source/drain region) in an overlying and/or an underlying layer, but a metal pillar has a shorter length compared to a length of a metal stripe. In one embodiment, the metal pillars are included in a power delivery network (e.g., used to deliver one or more voltage sources to the integrated circuit).

The tracks 302, 402, the metal conductors 304a, 304b, 304c, 304d, 304e, 304f of the ML3 layer 304, and the metal conductors 602a, 602b, 602c, 602d, 602e, 602f, 602g, 602h, 602i, 602j, 602k, 602l of the ML4 layer 602 are not orthogonal to the design boundary 212. As such, the layouts 300, 600 for the ML3 and the ML4 layers, respectively, are referred to as a non-orthogonal layouts and the metal layers 304, 602 as non-orthogonal metal layers. Additionally, the metal conductors 602a, 602b, 602c, 602d, 602e, 602f, 602g, 602h, 602i, 602j, 602k, 602l are orthogonal to the metal conductors 304a, 304b, 304c, 304d, 304e, 304f The metal conductors 304a, 304b, 304c, 304d, 304e, 304f are positioned at one hundred and thirty-five (135) degrees and the metal conductors 602a, 602b, 602c, 602d, 602e, 602f, 602g, 602h, 602i, 602j, 602k, 602l at forty-five (45) degrees with respect to the boundary edge 214.

Contacts 604 electrically connect some or all of the metal conductors 602a, 602b, 602c, 602d, 602e, 602f, 602g, 602h, 602i, 602j, 602k, 602l to respective metal conductors 304a, 304b, 304c, 304d, 304e, 304f In the illustrated embodiment, contacts 604 electrically connect the metal conductors 602c, 602e, 602g of the ML4 layer 602 to the metal conductor 304c of the ML3 layer 304, and the metal conductors 602f, 602h, 602j of the ML4 layer 602 to the metal conductor 304d of the ML3 layer 304. Contacts 604 electrically connect the metal conductors 602b, 602d of the ML4 layer 602 to the metal conductor 304b of the ML3 layer 304, the metal conductors 602i, 602k of the ML4 layer 602 to the metal conductor 304e of the ML3 layer 304, the metal conductor 602a of the ML4 layer 602 to the metal conductor 304a of the ML3 layer 304, and the metal conductor 602l of the ML4 layer 602 to the metal conductor 304f of the ML3 layer 304.

Figure 7:
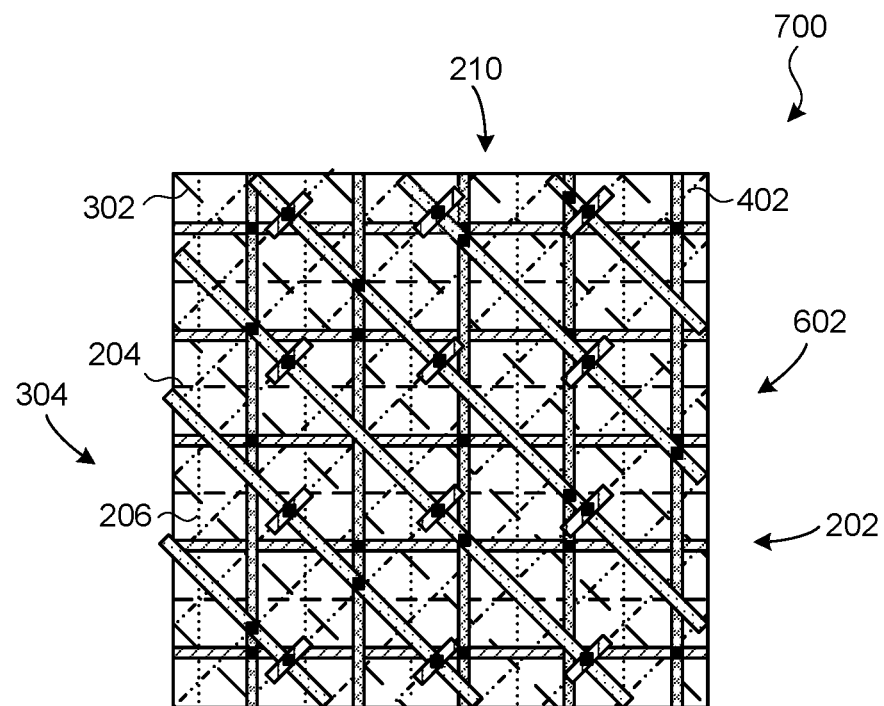
FIG. 7 depicts a complete layout for the metal layers in the second integrated circuit in accordance with some embodiments.

FIG. 7 depicts a complete layout for the metal layers in the second integrated circuit in accordance with some embodiments. The complete layout 700 includes the tracks 204, 206, 302, 402 and the ML1, the ML2, the ML3 and ML4 layers 202, 210, 304, 602. The tracks 204, 206 are included in orthogonal layouts (e.g., layouts 200, 208) and the tracks 302, 402 are in non-orthogonal layouts (e.g., layouts 300, 600). As described earlier, the metal conductors in the ML1, the ML2, and the ML3 layers 202, 210, 304 are implemented as metal stripes and the metal conductors in the ML4 layer 602 are implemented as metal pillars.

In one embodiment, some or all of the metal conductors 210a, 210b, 210c, 210d, 210e in the ML2 layer 210 are included in a PDN and some or all of the metal conductors 602a, 602b, 602c, 602d, 602e, 602f, 602g, 602h, 602i, 602j, 602k, 602l in the ML4 layer 602 are included in the PDN.

As such, the ML3 layer 304 is a transition layer. The metal conductors 304a, 304b, 304c, 304d, 304e, 304f are implemented as metal stripes and some or all of the metal conductors 304a, 304b, 304c, 304d, 304e, 304f connect respective metal conductors 210a, 210b, 210c, 210d, 210e in the underlying orthogonal metal layer (the ML2 layer 210) to respective metal conductors 602a, 602b, 602c, 602d, 602e, 602f, 602g, 602h, 602i, 602j, 602k, 602l in the overlying non-orthogonal metal layer (the ML4 layer 602). As described earlier, in some instances, the metal stripes in the transition layer (ML3 layer 304) can provide better electrical connections between the metal conductors in the orthogonal metal layer and the metal conductors in the non-orthogonal metal layer.

In another embodiment, the example layouts 200, 208 shown in FIG. 2 are combined with the example layouts shown in FIGS. 8-9 for the metal layers in a third integrated circuit. FIG. 8 illustrates the first example layout of the second metal layer shown in FIG. 2 and a third example layout for a third metal layer in a third integrated circuit in accordance with some embodiments. The layout 208 includes the tracks 206 for the ML2 layer 210 shown in FIG. 2 and the metal conductors 210a, 210b, 210c, 210d, 210e of the ML2 layer 210 positioned along some of the tracks 206. The tracks 206 underlying the metal conductors 210a, 210b, 210c, 210d, 210e are not visible in FIG. 8 because the metal conductors 210a, 210b, 210c, 210d, 2010e are disposed over the tracks 206. In the illustrated embodiment, the metal conductors 210a, 210b, 210c, 210d, 210e are implemented as metal stripes.

The layout 800 includes the tracks 302 for the ML3 layer 802 disposed in the v direction with respect to the boundary edge 214. The ML3 layer 802 is formed above the ML2 layer 210. In the illustrated embodiment, the w direction represents one hundred and thirty-five (135) degrees.

Metal conductors 802a, 802b, 802c, 802d, 802e, 802f, 802g, 802h, 802i, 802j, 802k of the ML3 layer 802 are positioned along some of the tracks 302. In FIG. 8, the metal conductors 802a, 802b, 802c, 802d, 802e, 802f, 802g, 802h, 802i, 802j, 802k are configured as metal pillars that are included in a power delivery network. In one embodiment, the locations of the metal conductors 802a, 802b, 802c, 802d, 802e, 802f, 802g, 802h, 802i, 802j, 802k are aligned to the metal conductors 210a, 210b, 210c, 210d, 210e.

The tracks 302 and the metal conductors 802a, 802b, 802c, 802d, 802e, 802f, 802g, 802h, 802i, 802j, 802k of the ML3 layer 802 are not orthogonal to the design boundary 212. As such, the layout 800 is a non-orthogonal layout and the ML3 layer 802 is a non-orthogonal metal layer. Additionally, the metal conductors 802a, 802b, 802c, 802d, 802e, 802f, 802g, 802h, 802i, 802j, 802k are not orthogonal to the metal conductors 210a, 210b, 210c, 210d, 210e. The metal conductors 210a, 210b, 210c, 210d, 210e are positioned at ninety (90) degrees and the metal conductors 802a, 802b, 802c, 802d, 802e, 802f, 802g, 802h, 802i, 802j, 802k at one hundred and thirty-five (135) degrees with respect to the boundary edge 214.

Contacts 804 electrically connect the metal conductors 802a, 802b, 802c, 802d, 802e, 802f, 802g, 802h, 802i, 802j, 802k to respective metal conductors 210a, 210b, 210c, 210d, 210e. In the illustrated embodiment, contacts 804 electrically connect the metal conductors 802a, 802f, 802k of the ML3 layer 802 to the metal conductor 210a of the ML2 layer 210. Contacts 804 also electrically connect the metal conductors 802d, 802i of the ML3 layer 802 to the metal conductor 210b, the metal conductors 802b, 802g to the metal conductor 210c, the metal conductors 802e, 802j to the metal conductor 210d, and the metal conductors 802c, 802h to the metal conductor 210e.

FIG. 9 depicts the third example layout of the third metal layer shown in FIG. 8 and an example third layout of a fourth metal layer in the third integrated circuit in accordance with some embodiments. The layout 800 of the ML3 layer 802 includes the tracks 302 and the metal conductors 802a, 802b, 802c, 802d, 802e, 802f, 802g, 802h, 802i, 802j, 802k of the ML3 layer 802 positioned along some of the tracks 302. The layout 900 includes the tracks 402 for the ML4 layer 902 disposed in the w direction with respect to the boundary edge 214. The ML4 layer 902 is formed above the ML3 layer 802. In the illustrated embodiment, the w direction represents forty-five (45) degrees.

Metal conductors 902a, 902b, 902c, 902d, 902e, 902f, 902g, 902h, 902i, 902j, 902k of the ML4 layer 902 are positioned along some of the tracks 402. Like the metal conductors 802a, 802b, 802c, 802d, 802e, 802f, 802g, 802h, 802i, 802j, 802k, the metal conductors 902a, 902b, 902c, 902d, 902e, 902f, 902g, 902h, 902i, 902j, 902k are implemented as metal pillars that are included in a power delivery network.

The tracks 302, 402, the metal conductors 802a, 802b, 802c, 802d, 802e, 802f, 802g, 802h, 802i, 802j, 802k in the ML3 layer 802, and the metal conductors 902a, 902b, 902c, 902d, 902e, 902f, 902g, 902h, 902i, 902j, 902k in the ML4 layer 902 are not orthogonal to the design boundary 212. As such, the layouts 800, 900 are non-orthogonal layouts and the metal layers 802, 902 are non-orthogonal metal layers. Additionally, the metal conductors 902a, 902b, 902c, 902d, 902e, 902f, 902g, 902h, 902i, 902j, 902k are orthogonal to the metal conductors 802a, 802b, 802c, 802d, 802e, 802f, 802g, 802h, 802i, 802j, 802k. The metal conductors 802a, 802b, 802c, 802d, 802e, 802f, 802g, 802h, 802i, 802j, 802k are positioned at one hundred and thirty-five (135) degrees and the metal conductors 902a, 902b, 902c, 902d, 902e, 902f, 902g, 902h, 902i, 902j, 902k at forty-five (45) degrees with respect to the boundary edge 214.

Contacts 904 electrically connect the metal conductors 902a, 902b, 902c, 902d, 902e, 902f, 902g, 902h, 902i, 902j, 902k in the ML4 layer 902 to respective metal conductors 802a, 802b, 802c, 802d, 802e, 802f, 802g, 802h, 802i, 802j, 802k in the ML3 layer 802.

FIG. 10 illustrates a complete layout for the metal layers in the third integrated circuit in accordance with some embodiments. The complete layout 1000 includes tracks 204, 206, 302, 402 and the ML1, the ML2, the ML3 and ML4 layers 202, 210, 802, 902. The tracks 204, 206 are included in orthogonal layouts (e.g., layouts 200, 208) and the tracks 302, 402 are in non-orthogonal layouts (e.g., layouts 800, 900). As described earlier, the metal conductors in the ML1 and the ML2 layers 202, 210 are implemented as metal stripes and the metal conductors in the ML3 and the ML4 layers 802, 902 are implemented as metal pillars.

In one embodiment, some or all of the metal conductors 202a, 202b, 202c, 202d, 202e in the ML1 layer 202 are included in a PDN and some or all of the metal conductors 802a, 802b, 802c, 802d, 802e, 802f, 802g, 802h, 802i, 802j, 802k in the ML3 layer 802 are included in the PDN. As such, the ML2 layer 210 is a transition layer. The metal conductors 210a, 210b, 210c, 210d, 210e are configured as metal stripes and some or all of the metal conductors 210a, 210b, 210c, 210d, 210e connect respective metal conductors 202a, 202b, 202c, 202d, 202e in the underlying orthogonal metal layer (the ML1 layer 202) to respective metal conductors 802a, 802b, 802c, 802d, 802e, 802f, 802g, 802h, 802i, 802j, 802k in the overlying non-orthogonal metal layer (the ML3 layer 802). As described earlier, in some instances, the metal stripes in the transition layer (ML2 layer 210) can provide better electrical connections between the metal conductors in the orthogonal metal layer and the metal conductors in the non-orthogonal metal layer.

Figure 11:
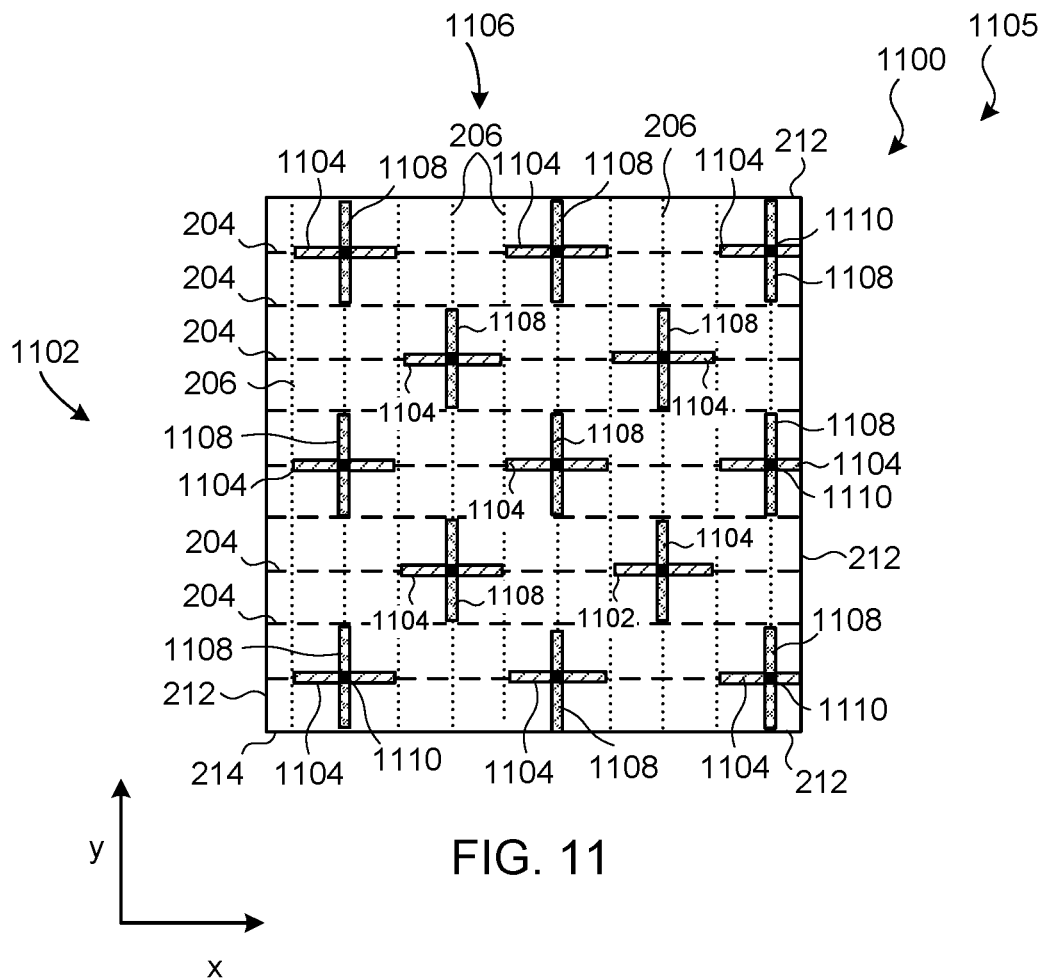
FIG. 11 depicts second example layouts of a first metal layer and a second metal layer in a fourth integrated circuit accordance with some embodiments.

In another embodiment, the example layouts shown in FIGS. 11-13 are combined for the metal layers in a fourth integrated circuit. FIG. 11 depicts second example layouts of a first metal layer and a second metal layer in the fourth integrated circuit in accordance with some embodiments. The layout 1100 of the ML1 layer 1102 includes the tracks 204 disposed in the x direction. Metal conductors 1104 of the ML1 layer 1102 are positioned along some of the tracks 204. In the illustrated embodiment, the metal conductors 1104 are configured as metal stripes. The metal stripes are included in a power delivery system in the example embodiment.

The layout 1105 of the ML2 layer 1106 includes the tracks 206 disposed in the y direction. The ML2 layer 1106 is formed above the ML1 layer 1102. Metal conductors 1108 of the ML2 layer 1106 are positioned along some of the tracks 206. Like the metal conductors 1104, the metal conductors 1108 are implemented as metal stripes. In one embodiment, the metal conductors 1108 snap to the closest location of a metal conductor 1104 or a track 206, and the metal conductors 1104 snap to the closest location of a track 204.

The tracks 204, 206, the metal conductors 1104, and the metal conductors 1108 are orthogonal with respect to the design boundary 212. As such, the layouts 1100, 1105 are orthogonal layouts and the metal layers 1102, 1106 are orthogonal metal layers. Additionally, the metal conductors 1108 are orthogonal to the metal conductors 1104. The metal conductors 1104 are positioned at zero (0) degrees and the metal conductors 1108 at ninety (90) degrees with respect to the boundary edge 214. The contacts 1110 electrically connect each metal conductor 1108 to a respective underlying metal conductor 1104.

FIG. 12 illustrates the second example layout of the second metal layer shown in FIG. 11 and a fourth example layout of a third metal layer in the fourth power delivery network in accordance with some embodiments. The layout 1105 for the ML2 layer 1106 includes the tracks 206 shown in FIG. 11 and the metal conductors 1108 positioned along some of the tracks 206. The layout 1200 includes the tracks 302 for a ML3 layer 1202 disposed in the v direction with respect to the boundary edge 214. The ML3 layer 1202 is formed above the ML2 layer 1106. In the illustrated embodiment, the v direction represents one hundred and thirty five (135) degrees.

Metal conductors 1204 of the ML3 layer 1202 are positioned along some of the tracks 302. In FIG. 12, the metal conductors 1204 of the ML3 layer 1202 are configured as metal pillars. In an example embodiment, the metal pillars are included in a power delivery network (e.g., are used to deliver one or more voltages). In one embodiment, the metal conductors 1204 snap to the closest location of a metal conductor 1108 or a track 302.

Contacts 1206 electrically connect the metal conductors 1204 to respective metal conductors 1108. As shown, the tracks 302 and the metal conductors 1204 are not orthogonal to the design boundary 212. As such, the layout 1200 is a non-orthogonal layout and the ML3 layer 1202 is a non-orthogonal metal layer. Additionally, the metal conductors 1204 are not orthogonal to the metal conductors 1108. The metal conductors 1108 are positioned at ninety (90) degrees and the metal conductors 1204 at one hundred and thirty five (135) degrees with respect to the boundary edge 214.

FIG. 13 depicts the fourth example layout of the third metal layer and a fourth example layout of a fourth metal layer in the fourth power delivery network in accordance with some embodiments. The layout 1200 for the ML3 layer 1202 includes the tracks 302 shown in FIG. 12 and the metal conductors 1204 positioned along some of the tracks 302. The layout 1300 includes the tracks 402 for a ML4 layer 1302 disposed in the w direction with respect to the boundary edge 214. The ML4 layer 1302 is formed above the ML3 layer 1202. In the illustrated embodiment, the w direction represents forty-five (45) degrees.

Metal conductors 1304 of the ML4 layer 1302 are positioned along some of the tracks 402. In FIG. 13, the metal conductors 1304 of the ML4 layer 1302 are configured as metal pillars. In one embodiment, the metal conductors 1304 snap to the closest location of a metal conductor 1204 or a track 402.

Contacts 1306 electrically connect the metal conductors 1304 to respective metal conductors 1204. As shown, the tracks 402 and the metal conductors 1304 of the ML4 layer 1302 are not orthogonal to the design boundary 212. As such, the layout 1300 is a non-orthogonal layout and the ML4 layer 1302 is a non-orthogonal metal layer. Additionally, the metal conductors 1304 are orthogonal to the metal conductors 1204. The metal conductors 1304 are positioned at forty-five (45) degrees and the metal conductors 1204 at one hundred and thirty five (135) degrees with respect to the boundary edge 214.

In one embodiment, some or all of the metal conductors 1104 in the ML1 layer 1102 are included in a PDN and some or all of the metal conductors 1204 in the ML3 layer 1202 are included in the PDN. As such, the ML2 layer 1106 is a transition layer. The metal conductors 1108 are configured as metal stripes and some or all of the metal conductors 1108 connect respective metal conductors 1104 in the underlying orthogonal metal layer (the ML1 layer 1102) to respective metal conductors 1204 in the overlying non-orthogonal metal layer (the ML3 layer 1202). As described earlier, in some instances, the metal stripes in the transition layer (ML2 layer 1106) can provide better electrical connections between the metal conductors in the orthogonal metal layer and the metal conductors in the non-orthogonal metal layer.

Figure 14:
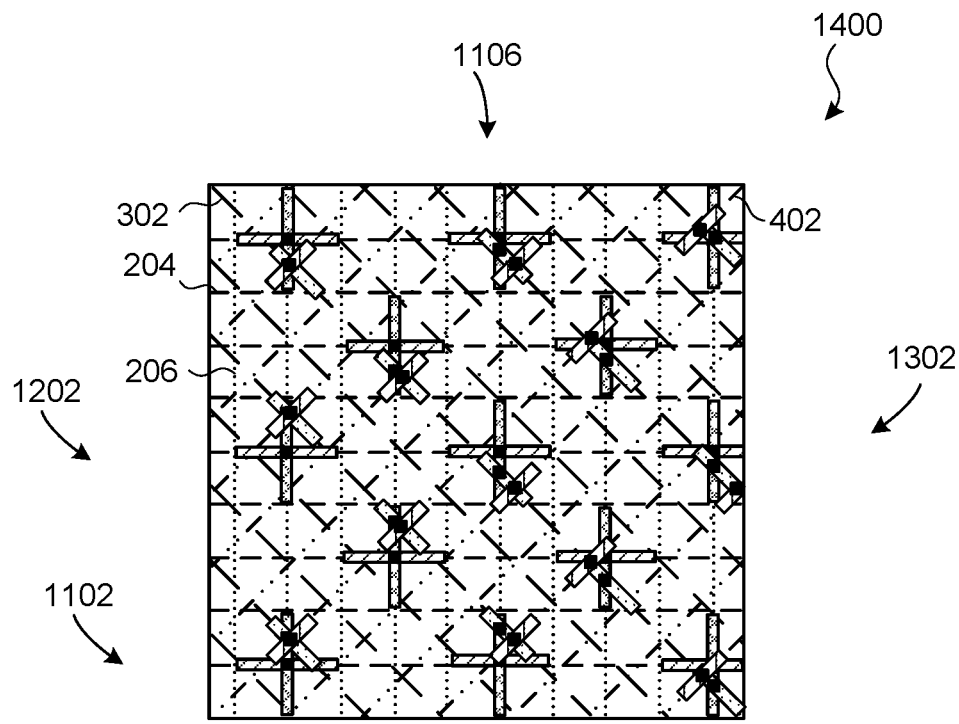
FIG. 14 illustrates a complete layout for the metal layers in the fourth integrated circuit in accordance with some embodiments.

FIG. 14 illustrates a complete layout for the metal layers in the fourth integrated circuits in accordance with some embodiments. The complete layout 1400 includes tracks 204, 206, 302, 402 and the ML1, the ML2, the ML3 and ML4 layers 1102, 1106, 1202, 1302. The tracks 204, 206 are included in orthogonal layouts (e.g., layouts 1100, 1105) and the tracks 302, 402 are in non-orthogonal layouts (e.g., layouts 1300, 1400). As described earlier, the metal conductors 1104, 1108 and configured as metal stripes and the metal conductors 1204, 1304 are implemented as metal pillars. In one embodiment, some or all of the metal stripes and the metal pillars in the ML1, ML2, ML3, and ML4 layers 1102, 1106, 1202, 1302 are included in a power delivery network.

Figure 15:
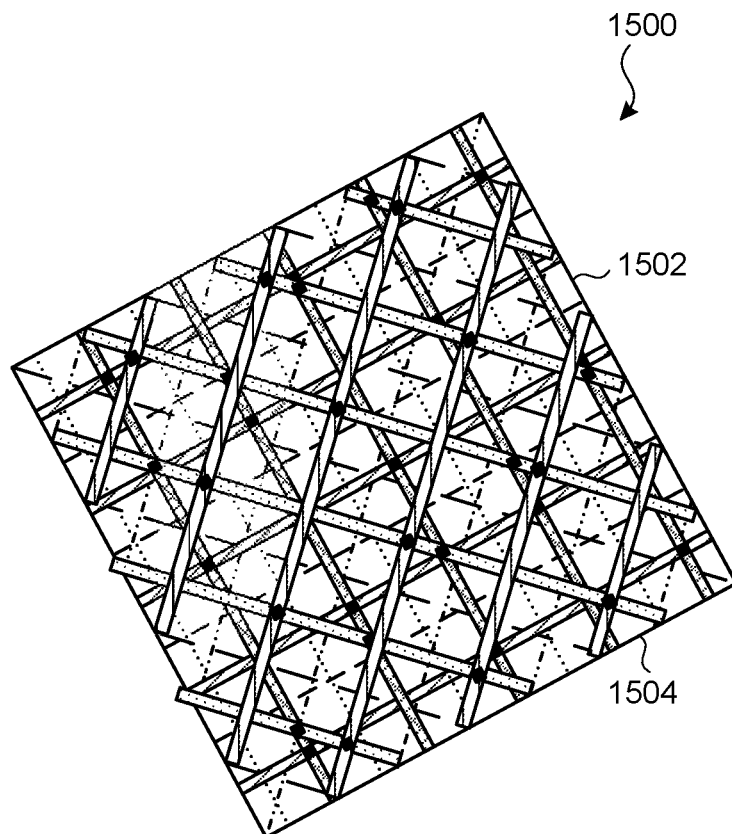
FIG. 15 depicts the layout shown in FIG. 5 on a non-orthogonal floor plan in accordance with some embodiments.

FIG. 15 depicts the layout shown in FIG. 5 on a non-orthogonal floor plan in accordance with some embodiments. The various layouts disclosed herein for the metal layers can be used in integrated circuits that have non-orthogonal floor plans. A non-orthogonal floor plan is a floor plan or area that has a design boundary that is not a arranged in a shape (e.g., a rectangle) that has vertical and horizontal sides (e.g., sides at zero (0) degrees and ninety (90) degrees on a Cartesian plane). In FIG. 15, the floor plan 1500 is defined by the design boundary 1502. The layouts for the metal layers include at two orthogonal layouts (e.g., layouts 200, 208) and two non-orthogonal layouts (e.g., layouts 300, 400) with respect to the design boundary edge 1504.

Figure 16:
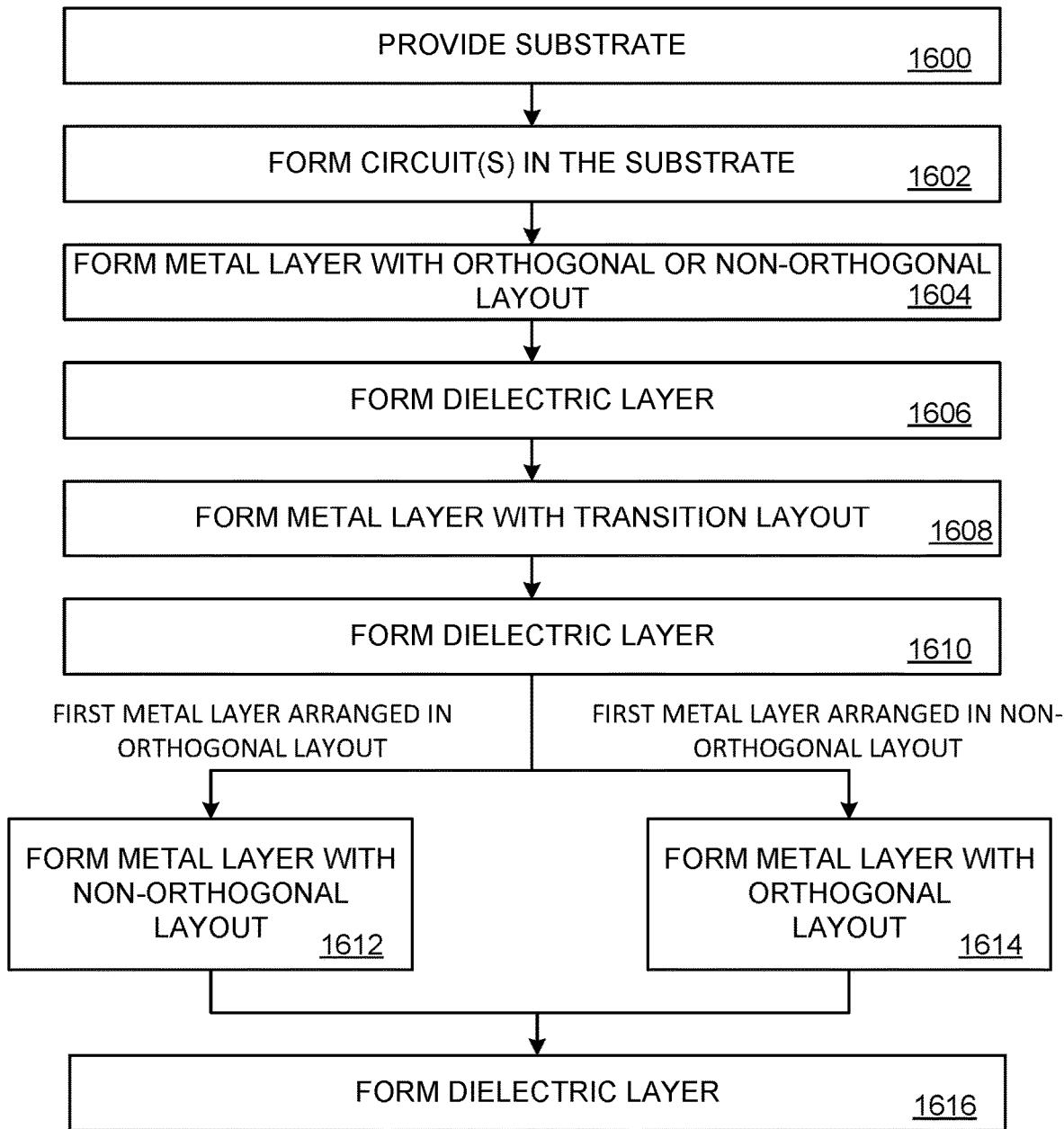
FIG. 16 illustrates a flowchart of an example first method of providing an integrated circuit in accordance with some embodiments.

FIG. 16 illustrates a flowchart of an example first method of providing an integrated circuit in accordance with some embodiments. Initially, as shown in block 1600, a substrate is provided. The substrate can be any suitable substrate. For example, the substrate may be a semiconductor substrate.

Next, as shown in block 1602, one or more circuits are formed in, on and/or above the substrate. A first metal layer is then formed over the substrate and the one or more circuits and the metal conductors in the first metal layer are arranged according to either an orthogonal layout or a non-orthogonal layout (block 1604). In the orthogonal layout, the metal conductors are orthogonal to a boundary design of the integrated circuit and the first metal layer is an orthogonal metal layer. In the non-orthogonal layout, the metal conductors are not orthogonal to the boundary design and the first metal layer is a non-orthogonal metal layer. In one embodiment, a metal layer includes the metal conductors and one or more metal contacts (e.g., a metal via). The metal conductors in the first metal layer can be configured as metal stripes or as metal pillars.

Next, as shown in block 1606, a dielectric layer is formed around and over the first metal layer. The dielectric layer electrically isolates the metal conductors and any metal contacts in the first metal layer from each other as well as from any underlying and overlying metal layers. A second metal layer is then formed over the dielectric layer and the metal conductors in the second metal layer are arranged according to a transition layout (block 1608). In one embodiment, the metal conductors in the second metal layer are implemented as metal stripes.

A dielectric layer is then formed around and over the second metal layer at block 1610. A third metal layer is formed over the dielectric layer and the metal conductors in the third metal layer are arranged according to either the orthogonal or the non-orthogonal layout. In one embodiment, the metal conductors in the third metal layer are arranged according to the non-orthogonal layout when the metal conductors in the first metal layer are arranged in the orthogonal layout (block 1612). In the non-orthogonal layout, the metal conductors in the third metal layer are not orthogonal to the design boundary and the third metal layer is a non-orthogonal metal layer. In another embodiment, the metal conductors in the third metal layer are arranged according to the orthogonal layout when the metal conductors in the first metal layer are arranged in the non-orthogonal layout (block 1614). The metal conductors in the third metal layer are orthogonal to the design boundary and the third metal layer is an orthogonal metal layer. Next, as shown in block 1616, a dielectric layer is formed around and over the third metal layer.

Figure 17A:
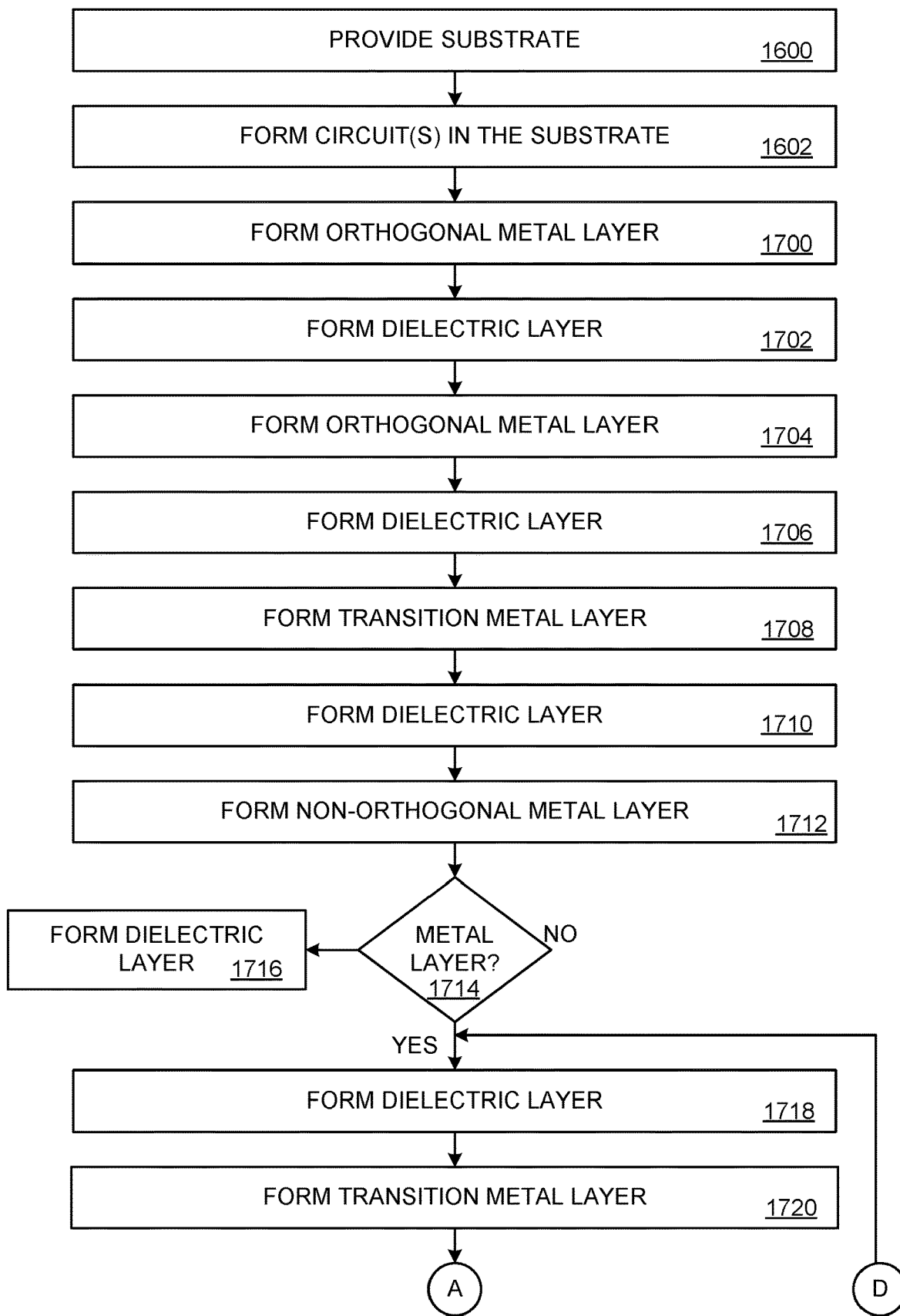
FIGS. 17A-17C depict a flowchart of an example second method of providing an integrated circuit in accordance with some embodiments.
Figure 17B:
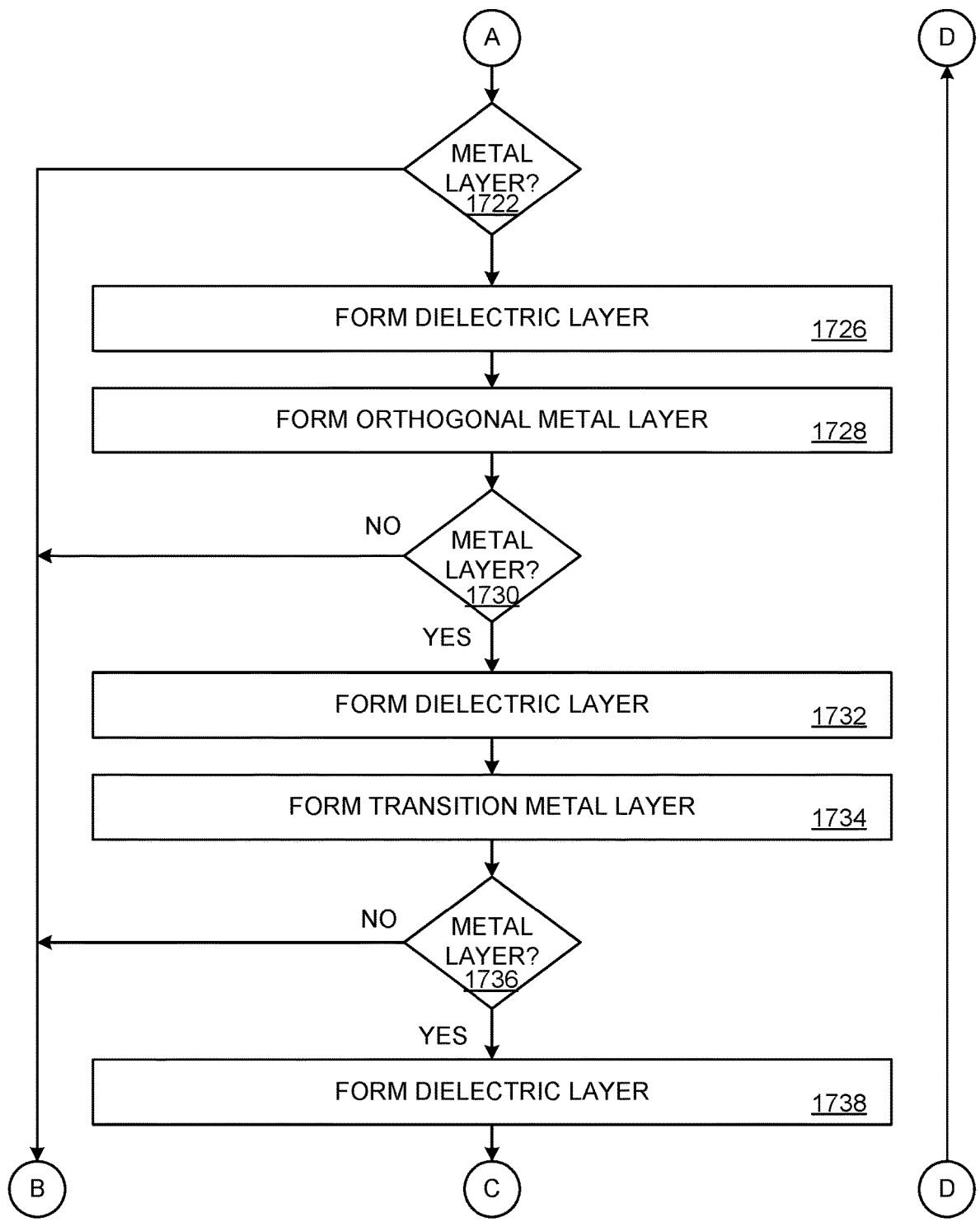
Figure 17C:
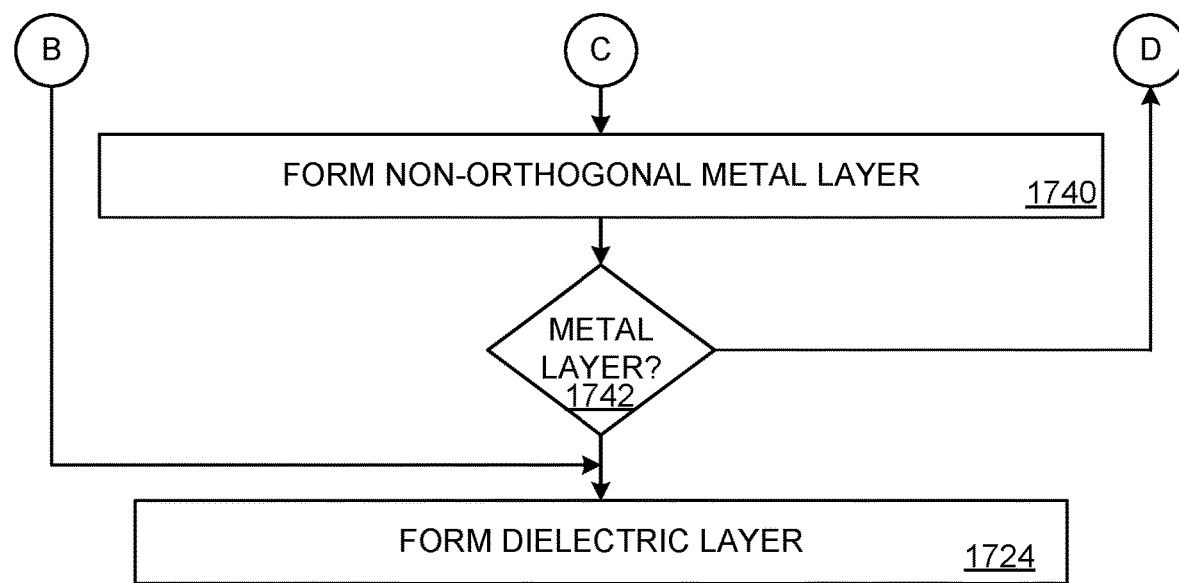

FIGS. 17A-17C illustrate a flowchart of an example second method of providing an integrated circuit in accordance with some embodiments. The illustrated process can use any suitable method to form a metal layer. In a non-limiting example, a metal material (or other conductive material) can be deposited or grown on the substrate or underlying dielectric layer and then patterned using one or more masks. Additionally, any suitable method can be used to form a dielectric layer. For example, a dielectric material may be deposited over an underlying metal layer and then patterned using one or more masks.

Initially, a substrate is provided and one or more circuits are formed in, on, and/or above the substrate (blocks 1600, 1602). A metal layer is then formed over the substrate as an orthogonal metal layer (block 1700). The metal conductors in the metal layer are arranged according to an orthogonal layout. The metal conductors in the orthogonal metal layer can be configured as metal stripes or as metal pillars. In one embodiment, a metal layer includes only the metal conductors. In another embodiment, a metal layer includes the metal conductors and one or more metal contacts (e.g., a metal via).

Next, as shown in block 1702, a dielectric layer is formed over and around the metal layer. Another orthogonal metal layer is then formed over the dielectric layer and the metal conductors in the orthogonal metal layer are arranged according to an orthogonal layout. The metal conductors in the orthogonal metal layer may be implemented as metal stripes or as metal pillars. The metal conductors in the metal layer formed at block 1704 are orthogonal to the metal conductors in the metal layer formed at block 1700. A dielectric layer is then formed around and over the metal layer at block 1706.

A transition metal layer is formed over the dielectric layer and the metal conductors in the transition metal layer are routed according to the transition layout (block 1708). In one embodiment, the metal conductors in the transition metal layer are implemented as metal stripes. At block 1710, another dielectric layer is formed around and over the metal layer. A non-orthogonal metal layer is then formed over the dielectric layer and the metal conductors in the non-orthogonal metal layer are arranged according to a non-orthogonal layout (block 1712). The metal conductors in the non-orthogonal metal layer can be configured as metal stripes or as metal pillars. Some or all of the metal conductors in the orthogonal metal layer produced at block 1704 and some or all of the metal conductors in the non-orthogonal metal layer formed at block 1712 are included in a PDN. The metal stripes in the transition metal layer produced at block 1708 can provide better electrical connections between the metal conductor(s) in the orthogonal metal layer and the metal conductor(s) in the non-orthogonal metal layer.

A determination is made at block 1714 as to whether or not another metal layer is to be formed. If not, the process passes to block 1716 where a dielectric layer is formed around and over the metal layer produced at block 1712. When a determination is made at block 1714 that another metal layer is to be formed, the method continues at block 1718 where a dielectric layer is formed around and over the metal layer produced at block 1712. Another transition metal layer is then formed over the dielectric layer and the metal conductors in the transition metal layer are routed based on a transition layout (block 1720). In one embodiment, the metal conductors in the transition metal layer are formed as metal stripes.

The method continues at block 1722 where a determination is made as to whether or not another metal layer is to be formed. If not, the process passes to block 1724 where a dielectric layer is formed around and over the metal layer produced at block 1720. When a determination is made at block 1722 that another metal layer is to be formed, the method continues at block 1726 where a dielectric layer is formed around and over the metal layer produced at block 1720. Another orthogonal metal layer is then formed over the dielectric layer and the metal conductors in the orthogonal metal layer are arranged according to an orthogonal layout (block 1728). The metal conductors in the orthogonal metal layer may be implemented as metal stripes or as metal pillars.

In one embodiment, some or all of the metal conductors in the non-orthogonal metal layer produced at block 1712 and some or all of the metal conductors in the orthogonal metal layer formed at block 1728 are included in the PDN. The metal stripes in the transition metal layer produced at block 1720 can provide better electrical connections between the metal conductor(s) in the orthogonal metal layer and the metal conductor(s) in the non-orthogonal metal layer.

A determination is made at block 1730 as to whether or not another metal layer is to be formed. If not, the process passes to block 1724. When a determination is made at block 1730 that another metal layer is to be formed, the method continues at block 1732 where a dielectric layer is formed around and over the metal layer produced at block 1728. Another transition metal layer is then formed over the dielectric layer and the metal conductors in the transition metal layer are arranged using a transition layout (block 1734). In one embodiment, the metal conductors in the transition metal layer are configured as metal stripes.

A determination is then made at block 1736 as to whether or not another metal layer is to be formed. If not, the process passes to block 1724. When a determination is made at block 1736 that another metal layer is to be formed, the method continues at block 1738 where a dielectric layer is formed around and over the metal layer produced at block 1734. Another non-orthogonal metal layer is then formed over the dielectric layer and the metal conductors in the non-orthogonal metal layer are positioned according to a non-orthogonal layout (block 1740). The metal conductors in the non-orthogonal metal layer can be configured as metal stripes or as metal pillars.

In one embodiment, some or all of the metal conductors in the orthogonal metal layer produced at block 1728 and some or all of the metal conductors in the non-orthogonal metal layer formed at block 1740 are included in the PDN. The metal stripes in the transition metal layer produced at block 1734 can provide better electrical connections between the metal conductor(s) in the orthogonal metal layer and the metal conductor(s) in the non-orthogonal metal layer.

A determination is made at block 1742 as to whether or not another metal layer is to be formed. If not, the process passes to block 1724. When a determination is made at block 1742 that another metal layer is to be formed, the method returns to block 1718 where a dielectric layer is formed around and over the most recently formed metal layer. The process repeats beginning at block 1720 until another metal layer will not be formed.

The method shown in FIGS. 17A-17C presents a process that forms metal layers that include one or more metal conductors that are included in a PDN as metal layers that sequence through an orthogonal metal layer, a transition metal layer, and a non-orthogonal metal layer. Other embodiments are not limited to this order. In some embodiments, the metal layers in a PDN in an integrated circuit can sequence through a non-orthogonal metal layer, a transition metal layer, and an orthogonal metal layer (e.g., as depicted in FIG. 16). In example embodiments, the layouts 300, 400 (FIG. 4) are used for the ML1 and ML2 layers, respectively (with the order of the metal layers 304, 404 reversed such that metal layer 404 is the ML1 layer and the metal layer 304 is the ML2 layer), and the layouts 200, 208 (FIG. 2) used for the ML3 and the ML4 layers (with the order of the metal layers 202, 210 reversed such that metal layer 210 is the ML3 layer and the metal layer 202 is the ML4 layer). In another example embodiment, the layouts 1200, 1300 (FIG. 13) are used for the ML1 and ML2 layers (with the order of the metal layers 1202, 1302 reversed such that metal layer 1302 is the ML1 layer and the metal layer 1202 is the ML2 layer), and the layouts 1100, 1105 (FIG. 11) used for the ML3 and the ML4 layers (with the order of the metal layers 1102, 1106 reversed such that metal layer 1106 is the ML3 layer and the metal layer 1102 is the ML4 layer). Generally, the layouts for the metal layers in an integrated circuit have a transition metal layer positioned between an orthogonal metal layer and a non-orthogonal metal layer.

Although the Figures depict a certain number of metal layers, metal conductors, and contacts as well as particular locations for the metal conductors and contacts, other embodiments are not limited to these configurations. An embodiment can include any number of metal layers, metal conductors, and/or contacts that may be positioned at any suitable location.

Additionally, as noted earlier, the orthogonal, transition, and non-orthogonal layouts can be used to arrange metal conductors that route signals in addition to, or as an alternative to, the metal conductors that provide the one or more voltage sources. The tracks for a metal layer that do not include power metal conductors may be used for signal metal conductors in and/or to one or more of the metal layers. The metal conductors that route signals can be metal lines or metal pillars. For example, as shown in FIG. 12, the metal conductors 1800 and 1802 may be used to transmit one or more signals between the ML2 layer 1106 and the ML3 layer 1202.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, an integrated circuit includes a first metal layer disposed above a substrate, a second metal layer formed above the first metal layer, a third metal layer disposed over the second metal layer, and a fourth metal layer disposed over the third metal layer. The first metal layer includes a first plurality of metal conductors that are routed according to an orthogonal layout. The second metal layer includes a second plurality of metal conductors that are routed according to the orthogonal layout. The metal conductors in the first plurality of metal conductors are orthogonal to the metal conductors in the second plurality of metal conductors. The third metal layer includes a third plurality of metal conductors that are routed according to a transition layout. The metal conductors in the third plurality of metal conductors are not orthogonal to the metal conductors in the second plurality of metal conductors. The fourth metal layer includes a fourth plurality of metal conductors that are routed according to a non-orthogonal layout. The metal conductors in the fourth plurality of metal conductors are orthogonal to the metal conductors in the third plurality of metal conductors.

In another aspect, an integrated circuit includes a substrate and a circuit formed in, on or above the substrate. An orthogonal conductor layer is disposed above the substrate. The orthogonal conductor layer includes a first conductive interconnect that is included in a power delivery system that delivers one or more voltage sources to the circuit. A transition conductor layer is disposed above the orthogonal conductor layer. The transition conductor layer includes a conductive stripe that is electrically connected to the first conductive interconnect. A non-orthogonal conductor layer is disposed above the transition conductor layer. The non-orthogonal conductor layer includes a second conductive interconnect that is electrically connected to the conductive stripe in the transition conductor layer and is included in the power delivery system that delivers the one or more voltage sources to the circuit.

In yet another aspect, a method for providing an integrated circuit includes forming a non-orthogonal conductor layer above a substrate, forming a transition conductor layer above the non-orthogonal conductor layer, and forming an orthogonal conductor layer above the transition conductor layer. The non-orthogonal conductor layer includes a first plurality of conductive interconnects arranged according to a non-orthogonal layout. The transition conductor layer comprising a plurality of conductive stripes arranged according to a transition layout. The orthogonal conductor layer including a second plurality of conductive interconnects arranged according to an orthogonal layout. Conductive interconnects in the first plurality of conductive interconnects and in the second plurality of conductive interconnects are included in a power delivery system that provides one or more voltage sources to a circuit. Each conductive stripe in the transition conductor layer is electrically connected to a respective conductive interconnect in the first plurality of conductive interconnects and a respective conductive interconnect in the second plurality of conductive interconnects.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. An integrated circuit, comprising:
a first metal layer including a first plurality of metal conductors that are routed according to one of an orthogonal layout or a non-orthogonal layout;
a second metal layer disposed above the first metal layer, the second metal layer including a second plurality of metal conductors that are routed according to another one of the orthogonal layout or the non-orthogonal layout, wherein metal conductors in the second plurality of metal conductors are not orthogonal to metal conductors in the first plurality of metal conductors; and
a third metal layer disposed above the second metal layer, the third metal layer including a third plurality of metal conductors that are routed according to the other one of the orthogonal layout or the non-orthogonal layout, wherein metal conductors in the third plurality of metal conductors are orthogonal to the metal conductors in the second plurality of metal conductors and the metal conductors in the second metal layer electrically connect the metal conductors in the first metal layer to the metal conductors in the third metal layer, and
wherein the metal conductors in the first plurality of metal conductors are metal stripes and the metal conductors in the second plurality of metal conductors are metal pillars.

2. The integrated circuit of claim 1, comprising a fourth metal layer disposed above a substrate and below the first metal layer, the fourth metal layer including a fourth plurality of metal conductors that are routed according to the one of the orthogonal layout or the non-orthogonal layout, wherein metal conductors in the fourth plurality of metal conductors are orthogonal to the metal conductors in the first plurality of metal conductors.

3. The integrated circuit of claim 1, wherein the metal conductors in the third plurality of metal conductors are one of metal stripes or metal pillars.

4. The integrated circuit of claim 1, wherein the metal conductors in the first plurality of metal conductors and the third plurality of metal conductors are metal stripes.

5. The integrated circuit of claim 1, wherein:
the metal conductors in the first plurality of metal conductors are included in a power distribution system that provides one or more voltages to a circuit formed in a substrate of the integrated circuit.

6. The integrated circuit of claim 1, wherein:
the metal conductors in the second plurality of metal conductors are included in a power distribution system that provides one or more voltages to a circuit formed in a substrate of the integrated circuit.

7. The integrated circuit of claim 1, wherein:
the metal conductors in the third plurality of metal conductors are included in a power distribution system that provides one or more voltages to a circuit formed in a substrate of the integrated circuit.

8. The integrated circuit of claim 1, comprising a fourth plurality of metal conductors in the first metal layer that are used to transmit signals to or from a circuit formed in a substrate of the integrated circuit.

9. An integrated circuit, comprising:
a substrate;
a circuit formed in, on, or above the substrate;
a first conductor layer that is one of an orthogonal conductor layer or a non-orthogonal conductor layer disposed above the substrate, the first conductor layer comprising a first conductive interconnect;
a transition conductor layer disposed above the first conductor layer, the transition conductor layer comprising a conductor that is electrically connected to the first conductive interconnect; and
a second conductor layer that is the other one of the orthogonal conductor layer or the non-orthogonal conductor layer and disposed above the transition conductor layer, the second conductor layer comprising a second conductive interconnect that is electrically connected to the conductor in the transition conductor layer,
wherein the first conductive interconnect is a metal stripe, and the second conductive interconnect is a metal pillar.

10. The integrated circuit of claim 9, wherein:
the first conductive interconnect is included in a power distribution system that provides one or more voltages to the circuit formed in, on, or above the substrate.

11. The integrated circuit of claim 9, wherein:
the second conductive interconnect is included in a power distribution system that provides one or more voltages to the circuit formed in, on, or above the substrate.

12. The integrated circuit of claim 9, comprising a third conductor layer that includes a third conductive interconnect included in a power distribution system that provides one or more voltages to the circuit formed in, on, or above the substrate.

13. The integrated circuit of claim 9, wherein the circuit includes at least one of an AND circuit, a NOR circuit, a NAND circuit, an OR circuit, and/or an inverter.

14. The integrated circuit of claim 9, further comprising a third conductive interconnect formed in the first conductor layer for transmitting one or more signals to or from the circuit.

15. The integrated circuit of claim 9, further comprising a third conductive interconnect formed in the second conductor layer for transmitting one or more signals to or from the circuit.

16. The integrated circuit of claim 9, wherein the conductor is a first conductive stripe in the transition conductor layer and comprising a second conductive stripe in the transition conductor layer for transmitting one or more signals to or from the circuit.

17. A method of providing an integrated circuit, the method comprising:
forming a first conductor layer comprising a first plurality of conductive interconnects arranged according to one of an orthogonal layout or a non-orthogonal layout;
forming a transition conductor layer above the first conductor layer, the transition conductor layer comprising a plurality of conductors arranged according to a transition layout; and
forming a second conductor layer above the transition conductor layer, the second conductor layer including a second plurality of conductive interconnects arranged according to the other one of the orthogonal layout or the non-orthogonal layout,
wherein each conductor of the plurality of conductors in the transition conductor layer is electrically connected to a respective conductive interconnect in the first plurality of conductive interconnects and a respective conductive interconnect in the second plurality of conductive interconnects, and
wherein the first plurality of conductive interconnects is a plurality of metal stripes, and the second plurality of conductive interconnects is a plurality of metal pillars.

18. The method of claim 17, wherein forming the first conductor layer includes forming the first conductor layer above a substrate and further comprising forming a circuit in the substrate.

19. The method of claim 17, further comprising forming a dielectric layer around and over each of the first conductor layer, the transition conductor layer, and the second conductor layer after each conductor layer is formed.

20. The method of claim 17, wherein at least one conductive interconnect of the first plurality of conductive interconnects is included in a power distribution system that provides one or more voltages to a circuit formed in, on, or above a substrate of the integrated circuit.

* * * * *